(12) United States Patent
Delsman et al.

(10) Patent No.: US 11,978,718 B2
(45) Date of Patent: May 7, 2024

(54) RIBBON BONDING TOOLS AND METHODS OF USING THE SAME

(71) Applicant: Kulicke and Soffa Indsutries, Inc., Fort Washington, PA (US)

(72) Inventors: Mark A. Delsman, Irvine, CA (US); Theodore J. Copperthite, Laguna Hills, CA (US); Garrett W. Jones, Newport Beach, CA (US); Todd J. Walker, Huntingdon Beach, CA (US); Tick-Kwang Loh, Irvine, CA (US); Jay C. McCandless, Irvine, CA (US)

(73) Assignee: Kulicke and Soffa Industries, Inc,., Fort Washington, PA (US)

( * ) Notice: Subject to any disclaimer, the term of this patent is extended or adjusted under 35 U.S.C. 154(b) by 461 days.

(21) Appl. No.: 17/071,062

(22) Filed: Oct. 15, 2020

(65) Prior Publication Data

US 2021/0028143 A1 Jan. 28, 2021

Related U.S. Application Data

(63) Continuation of application No. 15/924,024, filed on Mar. 16, 2018, now Pat. No. 10,847,491, which is a continuation of application No. 14/705,341, filed on May 6, 2015, now Pat. No. 9,929,122, which is a continuation of application No. 13/738,421, filed on Jan. 10, 2013, now abandoned, which is a continuation of application No. 13/145,676, filed as
(Continued)

(51) Int. Cl.
*B23K 20/04* (2006.01)
*B23K 20/00* (2006.01)
*B23K 20/10* (2006.01)
*H01L 23/00* (2006.01)
*B23K 101/40* (2006.01)

(52) U.S. Cl.
CPC ............ *H01L 24/78* (2013.01); *B23K 20/004* (2013.01); *B23K 20/106* (2013.01); *B23K 2101/40* (2018.08); *H01L 2224/78355* (2013.01)

(58) Field of Classification Search
None
See application file for complete search history.

(56) References Cited

U.S. PATENT DOCUMENTS 3,627,190 A 12/1971 Ramsey
3,934,783 A 1/1976 Larrison
(Continued)

FOREIGN PATENT DOCUMENTS

CN 1531044 9/2004
CN 1678424 10/2005
(Continued)

OTHER PUBLICATIONS

Hartman, George, "Wire Bonding in Microelectronics," 3rd Edition, 1997, p. 38.
(Continued)

*Primary Examiner* — Devang R Patel
(74) *Attorney, Agent, or Firm* — Christopher M. Spletzer, Sr.

(57) ABSTRACT

A ribbon bonding tool including a body portion is provided. The body portion includes a tip portion. The tip portion including a working surface, the tip portion including two side wall portions on either side of the working surface wherein a ribbon path is defined between the side wall portions.

18 Claims, 20 Drawing Sheets

Related U.S. Application Data application No. PCT/US2010/023273 on Feb. 5, 2010, now abandoned.

(60) Provisional application No. 61/150,596, filed on Feb. 6, 2009, provisional application No. 61/150,640, filed on Feb. 6, 2009, provisional application No. 61/150,611, filed on Feb. 6, 2009, provisional application No. 61/150,625, filed on Feb. 6, 2009, provisional application No. 61/150,633, filed on Feb. 6, 2009, provisional application No. 61/150,579, filed on Feb. 6, 2009.

(56) References Cited

U.S. PATENT DOCUMENTS

| | | | |
|---|---|---|---|
| 3,971,499 | A | 7/1976 | Goodrich et al. |
| 4,596,352 | A | 6/1986 | Knapp |
| 4,776,509 | A | 10/1988 | Pitts et al. |
| 4,976,392 | A | 12/1990 | Smith et al. |
| 5,288,006 | A | 2/1994 | Otsuka et al. |
| 5,503,321 | A | 4/1996 | Urushima |
| 5,868,301 | A | 2/1999 | DiStefano et al. |
| 6,286,746 | B1 | 9/2001 | Egan et al. |
| 6,523,732 | B1 | 2/2003 | Popoola et al. |
| 6,824,630 | B2 | 11/2004 | Oishi et al. |
| 7,247,588 | B2 | 7/2007 | Kwon et al. |
| 7,249,702 | B2 | 7/2007 | Mironescu et al. |
| 7,413,108 | B2 | 8/2008 | Vasquez et al. |
| 2005/0194423 | A1 | 9/2005 | Okita |
| 2006/0065697 | A1 | 3/2006 | Kobae et al. |
| 2006/0118932 | A1 | 6/2006 | Nanba et al. |
| 2006/0163315 | A1 | 7/2006 | Delsman et al. |
| 2006/0169388 | A1 | 8/2006 | Shimizu et al. |
| 2006/0180635 | A1 | 8/2006 | Lim et al. |
| 2007/0141755 | A1 | 6/2007 | Luechinger |
| 2009/0152327 | A1 | 6/2009 | Matsumura |
| 2009/0152697 | A1 | 6/2009 | Tamimoto et al. |
| 2010/0170935 | A1 | 7/2010 | Stroh et al. |

FOREIGN PATENT DOCUMENTS

| | | |
|---|---|---|
| CN | 101061079 | 10/2007 |
| JP | 2943381 | 11/1992 |
| JP | 2003-158149 | 5/2003 |
| JP | 2007035827 | 2/2007 |
| WO | 2008148814 | 12/2008 |

OTHER PUBLICATIONS

International Search Report for International Patent Application No. PCT/US2010/023273, dated Aug. 25, 2010.

Search Report for Chinese patent Application No. 201610006899.7, dated Aug. 22, 2017.

RIBBON BONDING TOOLS AND METHODS OF USING THE SAME

CROSS-REFERENCE TO RELATED APPLICATIONS

This application is a continuation of U.S. patent application Ser. No. 15/924,024, filed Mar. 16, 2018, which is a continuation of U.S. patent application Ser. No. 14/705,341, filed May 6, 2015, which is a continuation of U.S. patent application Ser. No. 13/378,421, filed Jan. 10, 2013, which claims the benefit of U.S. patent application Ser. No. 13/145,676, filed Jul. 21, 2011, which claims the benefit of International Patent Application No. PCT/US2010/023273 filed Feb. 5, 2010, which claims the benefit of U.S. Provisional Application Nos. 61/150,633; 61/150,596; 61/150,611; 61/150,625; 61/150,579; and 61/150,640, each of which was filed Feb. 6, 2009, the contents of which are incorporated herein by reference.

FIELD OF THE INVENTION

The present invention relates to bonding tools used in ribbon bonding systems, and more particularly, to improved tip portions of ribbon bonding tools.

BACKGROUND OF THE INVENTION

In the processing and packaging of semiconductor devices, wire bonding continues to be a primary method of providing electrical interconnection between two locations within a package (e.g., between a die pad of a semiconductor die and a lead of a leadframe). To form wire loops to provide this interconnection, bonding tools (e.g., capillary tools used during ball bonding, wedge tools used in wedge bonding) are used to press a wire against a bonding location using ultrasonic, thermosonic, or thermocompressive energy.

In the assembly of certain devices (e.g., power semiconductor devices) ribbon bonding may be used to provide electrical interconnection between locations. For example, U.S. Patent Application Publication Nos. 2006/0163315 (entitled Ribbon Bonding Tool and Process) and 2007/0141755 (entitled Ribbon Bonding in an Electronic Package) relate to ribbon bonding and are incorporated herein by reference.

Various of the drawings disclosed herein (e.g., FIGS. 1, 2, and 3A-3F) are useful in explaining conventional ribbon bonding tools and systems, as well as ribbon bonding tools and systems according to the present invention. FIG. 1 illustrates semiconductor die 110 supported by substrate 108 (e.g., leadframe 108). It is desired to provide a conductive interconnection between a location(s) on semiconductor die 110 (e.g., a die pad) and lead 108a of leadframe 108. Ribbon loop 112 provides such interconnection and includes first bond 112a and second bond 112b (both bonded to portions of semiconductor die 110), as well a third bond 112c on lead 108. Ribbon loop 112 is formed using ribbon bonding system 100 (e.g., a ribbon bonding machine). As is understood by those skilled in the art, a ribbon bonding system includes many conventional components and subsystems such as a material handling system, a vision system, a computer, and many others. However, for simplicity, only a few elements of ribbon bonding system 100 are shown. Such elements include ribbon bonding tool 102, ribbon guide 104, and cutting tool 106. During formation of ribbon loops (such as ribbon loop 112) a ribbon material is fed to ribbon bonding tool 102 from a ribbon supply (not shown) using ribbon guide 104. Ribbon bonding uses energy (e.g., ultrasonic energy to form bonds), and then, after formation of a ribbon loop, cutter 106 may be used to at least partially cut through the ribbon material prior to separation of the ribbon loop from the ribbon supply.

FIG. 2 is a perspective view of ribbon bonding tool 102 engaged in aperture 114a of ultrasonic transducer 114, where ribbon bonding tool 102 is aligned in aperture 114a using flat surface side 102k (in this case, front side 102k). As is understood by those skilled in the art, transducer 114 causes a "scrubbing" motion at the tip portion 102a, and particular, to working surface 102b of ribbon bonding tool 102. FIGS. 3A-3F are various views of exemplary ribbon bonding tool 102. FIG. 3A is a front view of tool 102, FIG. 3B is a top view of tool 102 (illustrating flat surface side 102k), FIG. 3C is a bottom view illustrating working surface 102b, FIG. 3D is a detailed view of a portion of FIG. 3A illustrating front edge 102d of tip portion 102a adjacent working surface 102b, FIG. 3E is a side view of tool 102, and FIG. 3F is a detailed view of a portion of FIG. 3E illustrating side edge 102f1 of tip portion 102a adjacent working surface 102b.

Certain ribbon bonding tools have features formed on the working surface such as those shown in U.S. Patent Application Publication No. 2006/0163315 entitled Ribbon Bonding Tool and Process. FIG. 4A is an exemplary tip portion 102a of a conventional ribbon bonding tool 102. Tip portion includes working surface 102b, front edge 102d, back edge 102e, side edge 102f1, and side edge 102f2. Working surface 102b defines protrusions 102b1 and recesses 102b2 (where the protrusions and recesses may be part of a waffle or grid pattern on the working surface), where recesses 102b2 are between protrusions 102b1. A typical scrubbing motion of a ribbon bonding tool is from front to back, along the direction of the ribbon. In FIG. 4A, the scrubbing would typically occur in direction "d" which extends in a direction from front edge 102d to back edge 102e.

FIG. 4B is a perspective view of a portion of ribbon loop 112 including first bond 112a bonded to bonding location 110. First bond 112a is formed using a "waffle" type ribbon bonding tool (similar to that shown in FIG. 4A) which forms openings/recesses 112a2 between protrusions 112a1. Unfortunately, conventional waffle style ribbon bond tools suffer from a number of deficiencies. For example, the edges of the protrusions on the working surface of the ribbon bonding tool tend to leave an irregular edge in the heel region of the ribbon bond, which may initiate cracks 112a3 at some point during the life of the ribbon bond. Other limitations of existing ribbon bonding tools relate to ribbon looping difficulties, amongst others.

Thus, it would be desirable to provide improved ribbon bonding tools.

SUMMARY OF THE INVENTION

According to an exemplary embodiment of the invention, a ribbon bonding tool including a body portion is provided. The body portion includes a tip portion. The tip portion includes a working surface between a front edge of the tip portion and a back edge of the tip portion. The working surface includes a region defining at least one of a plurality of recesses and a plurality of protrusions. The working surface also defines at least one of (a) a first planar portion between the region and the front edge of the tip portion, and (b) a second planar portion between the region and the back edge of the tip portion.

According to another exemplary embodiment of the present invention, a ribbon bonding tool including a body portion is provided. The body portion includes a tip portion. The tip portion includes a working surface between a front edge of the tip portion and a back edge of the tip portion. The working surface defines a plurality of recesses, wherein a portion of the recesses defined by the working surface adjacent at least one of the front edge and the back edge are deeper than others of the recesses.

According to another exemplary embodiment of the present invention, a ribbon bonding tool including a body portion is provided. The body portion includes a tip portion. The tip portion includes a working surface, wherein during engagement with a transducer of a ribbon bonding system, the working surface extends lower in a center region than (a) at a first surface region extending from a first edge of the working surface toward the center region, and (b) at a region extending from a second edge of the working surface toward the center region, a length of the first surface region being at least 25% of a length of the working surface from the first edge to the second edge, a length of the second surface region being at least 25% of a length of the working surface from the first edge to the second edge.

According to another exemplary embodiment of the present invention, a ribbon bonding tool including a body portion is provided. The body portion includes a tip portion. The tip portion including a working surface. The tip portion includes two side wall portions on either side of the working surface wherein a ribbon path is defined between the side wall portions.

According to another exemplary embodiment of the present invention, a ribbon bonding tool including a body portion is provided. The body portion includes a tip portion. The tip portion includes a working surface. The tip portion includes two side wall portions extending along an exterior surface of at least a portion of a back side of the ribbon bonding tool wherein a ribbon path is defined between the side wall portions.

The inventive ribbon bonding tools may also be integrated into inventive ribbon bonding systems including various elements such as bond head elements (e.g., ultrasonic transducers, ribbon cutter, ribbon material guides), as well as other elements.

Further, the invention may also be considered in connection with methods of forming ribbon loops. Such methods may include a step of forming a ribbon bond of a ribbon loop on a first bonding location, extending the ribbon material toward a second bonding location, forming another ribbon bond on the second bonding location, and separating the now completed ribbon loop from the ribbon supply (using a ribbon cutter, if desired, to assist in the separation). Such a method is accomplished using an inventive ribbon bonding tool (and other elements of a ribbon bonding system) according to the exemplary embodiments disclosed herein.

BRIEF DESCRIPTION OF THE DRAWINGS

The invention is best understood from the following detailed description when read in connection with the accompanying drawing. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

According to certain exemplary embodiments of the present invention, the working surface (also known as a "foot")

of a ribbon bonding tool includes a region defining at least one of a plurality of recesses and a plurality of protrusions (such as in a waffle or grid pattern). The working surface also defines at least one planar portion, along at least one edge of the working surface. FIGS. 5A, 6A, and 6C-6H illustrate an example of such a ribbon bonding tool, with FIGS. 5B and 6B illustrating portions of ribbon loops. The planar portions may have dimensions (e.g., width, height, etc.) that vary. The planar portions are not required to be perfectly flat or smooth, but rather are smoother or flatter than the edges of a standard waffle tool. Such planar portions tend to improve looping capability and reduction of crack initiation sites in the heel region of the ribbon loop.

Figure 5A:
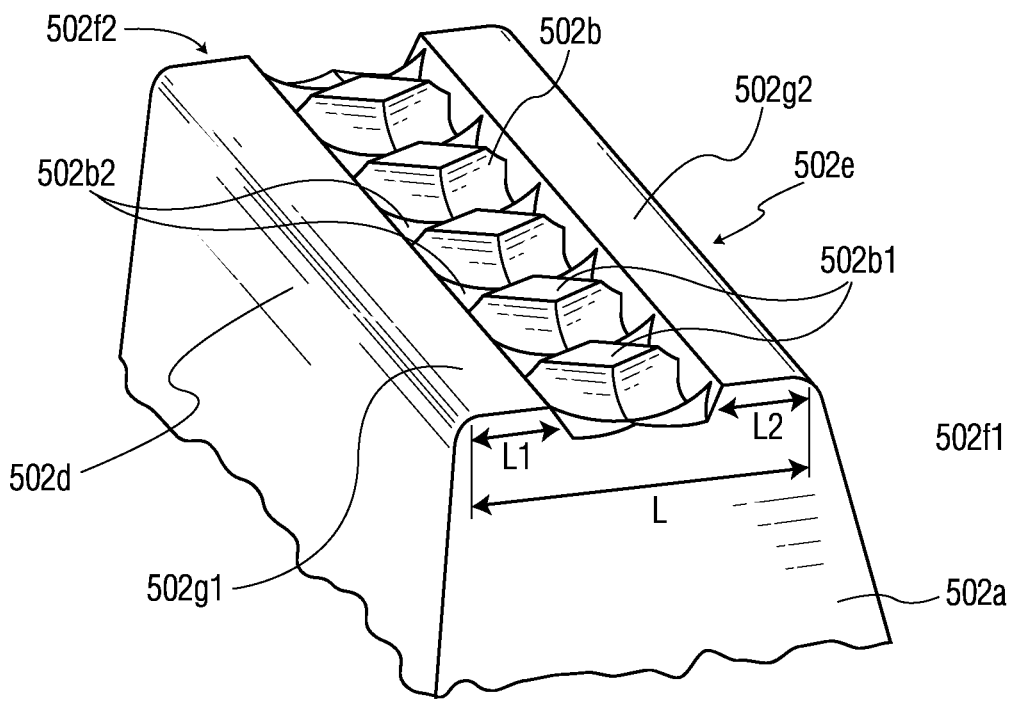
FIG. 5A is a perspective view of a tip portion of a ribbon bonding tool in accordance with an exemplary embodiment of the present invention.
Figure 5B:
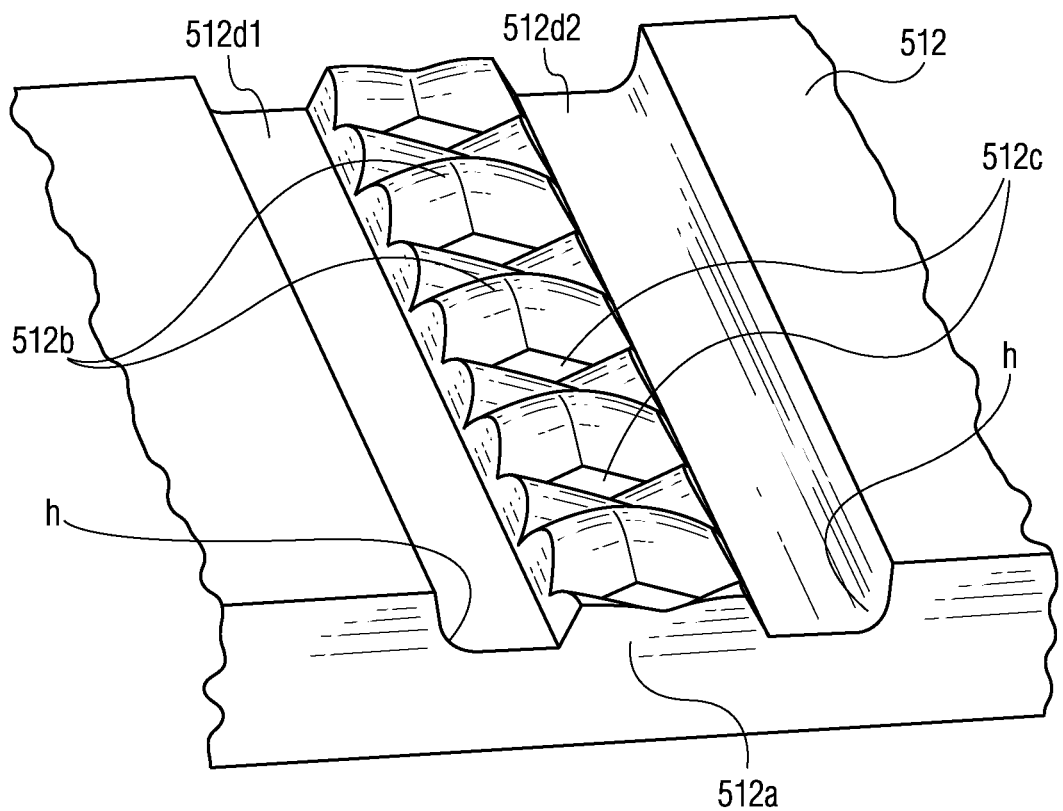
FIG. 5B is a portion of a ribbon loop formed using the ribbon bonding tool of FIG. 5A.

FIG. 5A is a perspective bottom view of tip portion 502a of a ribbon bonding tool. Tip portion 502a includes working surface 502b between front edge 502d and back edge 502e (and also defined between side edge 502f1 and side edge 502f2). Working surface 502b includes a region defining protrusions 502b1 and recesses 502b2 (similar to a waffle pattern). Working surface 502b also defines first planar portion 502g1 between the region and front edge 502d, and second planar portion 502g2 between the region and back edge 502e. In contrast to conventional waffle tools where the entire working surface defines protrusions/recesses, planar portions 502g1 and 502g2 leave smooth heel regions during ribbon looping with decreased potential for crack-initiation sites. The length L1 of the first planar portion (or the length L2 of the second planar portion) may be between 5-40 percent of the length L from front edge 502d to back edge 502e.

FIG. 5B illustrates a portion of ribbon loop 512 formed using the ribbon bonding tool of FIG. 5A. Portion 512a of ribbon loop 512 corresponds to the region of working surface 502b including protrusions 502b1 and recesses 502b2. More specifically, protrusions 512b of portion 512a correspond to recesses 502b2 of working surface 502b, and recesses 512c of portion 512a correspond to protrusions 502b1 of working surface 502b. Planar portions 512d1 and 512d2 correspond to planar portions 502g1 and 502g2 of working surface 502b, and provide desirable heel regions "h" in ribbon loop 512.

In the configuration shown in FIG. 5A, the region of working surface 502b defining protrusions 502b1 and recesses 502b2 is mostly below a plane defined across planar portions 502g1 and 502g2 (i.e., the top of protrusions 502b1 is at substantially the same height as planar portions 502g1 and 502g2). However, the region could extend above a plane defined across planar portions 502g1 and 502g2.

Figure 6A:
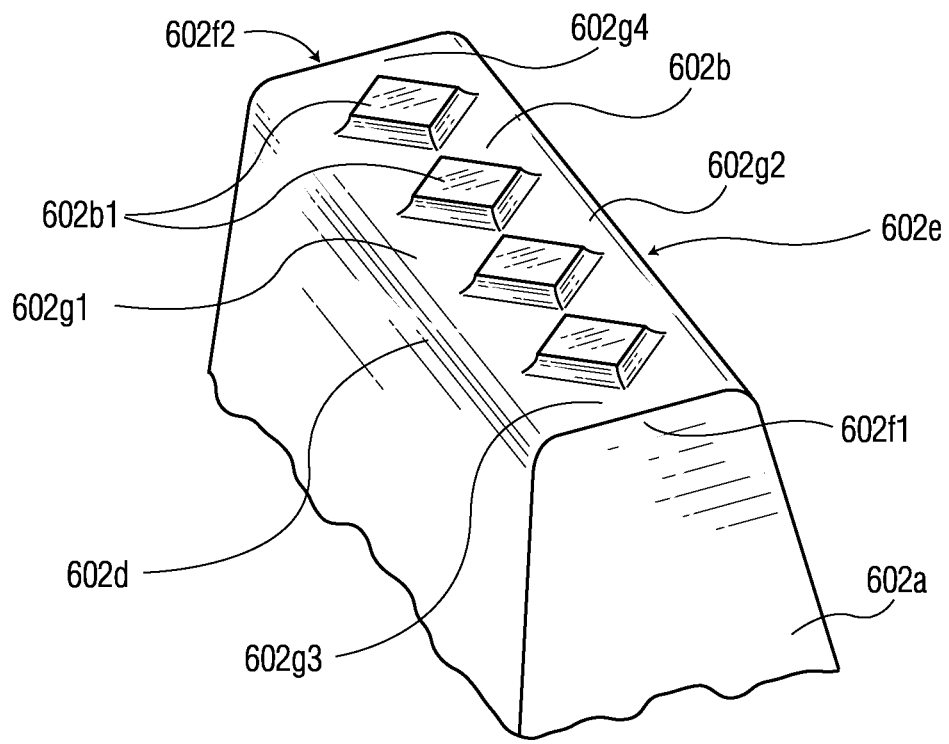
FIG. 6A is a perspective view of a tip portion of a ribbon bonding tool in accordance with an exemplary embodiment of the present invention.
Figure 6B:
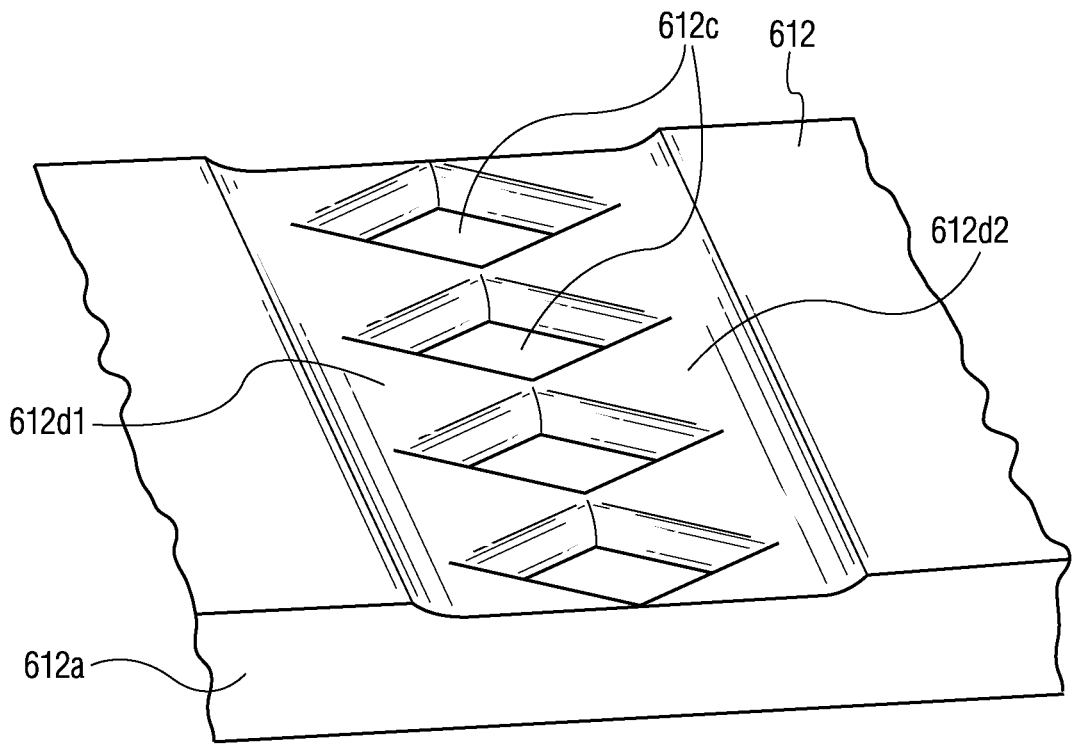
FIG. 6B is a portion of a ribbon loop formed using the ribbon bonding tool of FIG. 6A.

Referring now to FIG. 6A, a perspective bottom view of tip portion 602a of a ribbon bonding tool is shown. Tip portion includes working surface 602b between front edge 602d and back edge 602e (and also defined between side edge 602f1 and side edge 602f2). Working surface 602b includes a region defining protrusions 602b1. Working surface 602b also defines first planar portion 602g1 between the region and front edge 602d, second planar portion 602g2 between the region and back edge 602e, third planar portion 602g3 between the region and side edge 602f2, and fourth planar portion 602g4 between the region and side edge 602f2. FIG. 6B illustrates portion 612a of ribbon loop 612 formed using the ribbon bonding tool of FIG. 6A. Portion 612a includes recesses 612c corresponding to protrusions 602b1 of working surface 602b, and planar portions 612d1 and 612d2. FIGS. 6C-6H are similar to the embodiment shown in FIG. 6A, where like reference numerals correspond to like elements of the ribbon bonding tool.

Figure 6C:
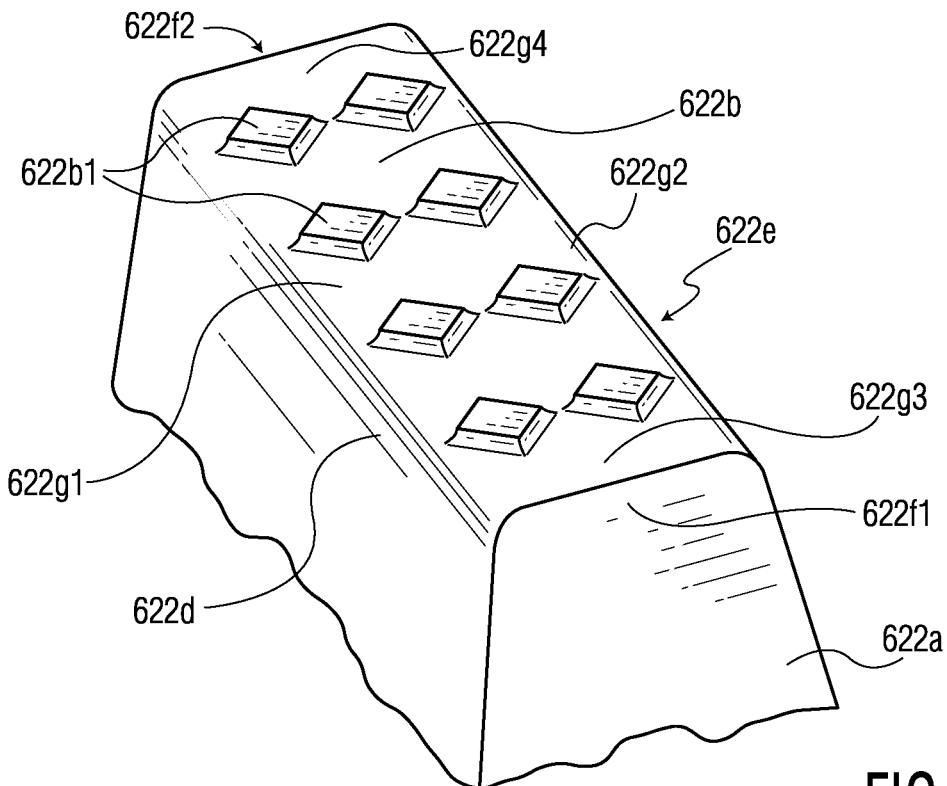
FIGS. 6C-6H are perspective views of tip portions of ribbon bonding tools in accordance with various exemplary embodiments of the present invention.

FIG. 6C illustrates tip portion 622a including working surface 622b between front edge 622d, back edge 622e, side edge 622f1, and side edge 622f2. Working surface 622b includes a region defining two rows of diamond shaped protrusions 622b1. Working surface 622b also defines first planar portion 622g1 between the region and front edge 622d, second planar portion 622g2 between the region and back edge 622e, third planar portion 622g3 between the region and side edge 622f1, and fourth planar portion 622g4 between the region and side edge 622f2. Of course, other shapes and configurations of protrusions on the working surface are contemplated.

Figure 6D:
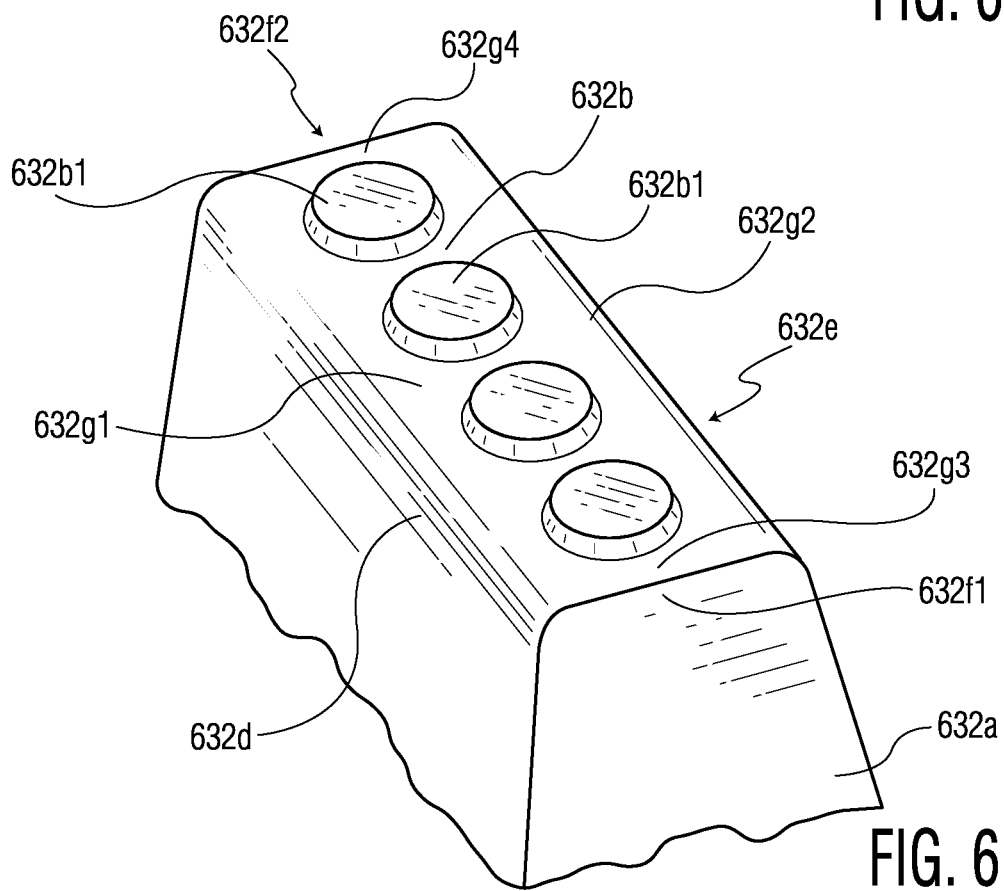
Figure 6E:
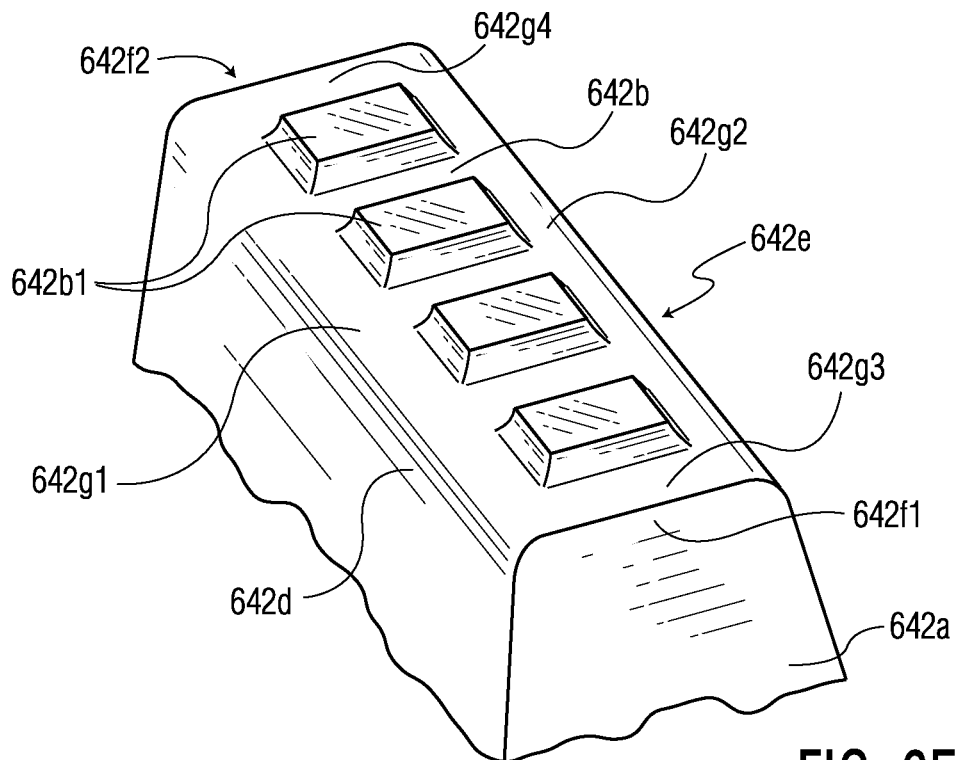

FIG. 6D illustrates tip portion 632a including working surface 632b between front edge 632d, back edge 632e, side edge 632f1, and side edge 632f2. Working surface 632b includes a region defining round shaped protrusions 632b1. Working surface 632b also defines first planar portion 632g1 between the region and front edge 632d, second planar portion 632g2 between the region and back edge 632e, third planar portion 632g3 between the region and side edge 632f1, and fourth planar portion 632g4 between the region and side edge 632f2. FIG. 6E illustrates tip portion 642a including working surface 642b between front edge 642d, back edge 642e, side edge 642f1, and side edge 642f2. Working surface 642b includes a region defining rectangular shaped protrusions 642b1. Working surface 642b also defines first planar portion 642g1 between the region and front edge 642d, second planar portion 642g2 between the region and back edge 642e, third planar portion 642g3 between the region and side edge 642f1, and fourth planar portion 642g4 between the region and side edge 642f2.

Figure 6F:
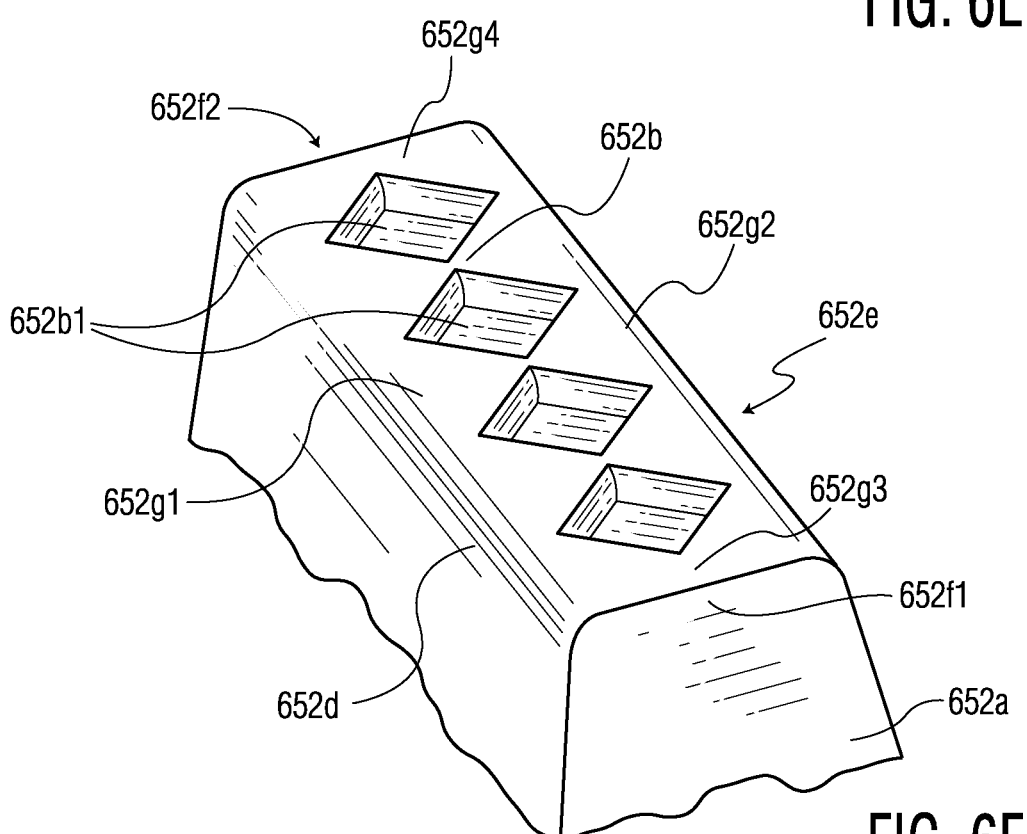
Figure 6G:
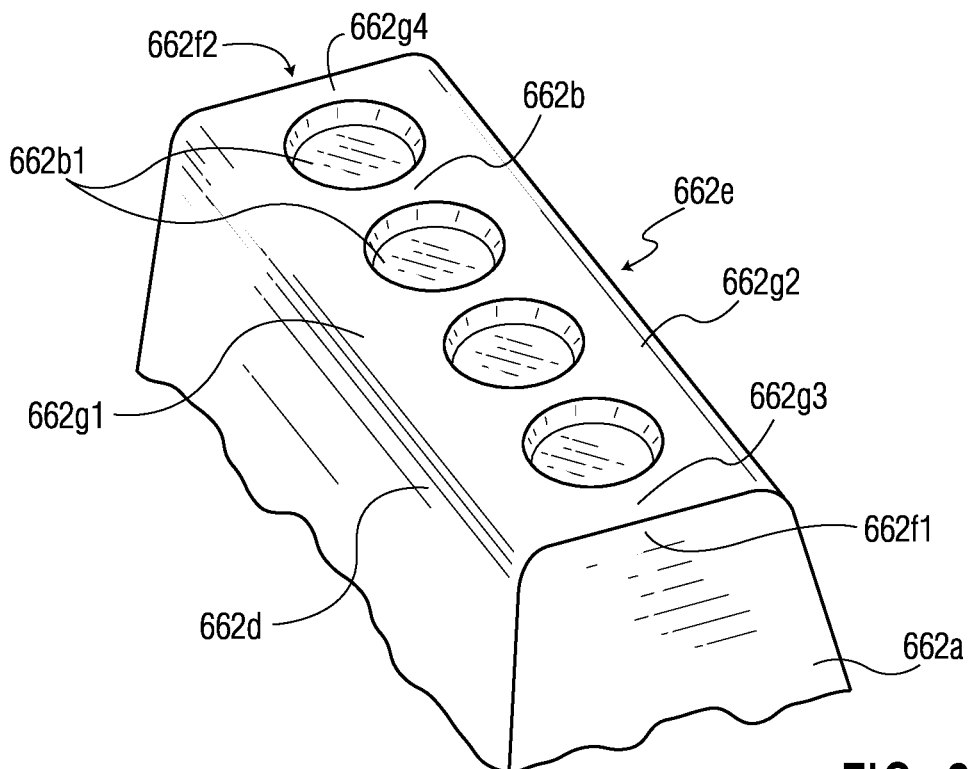
Figure 6H:
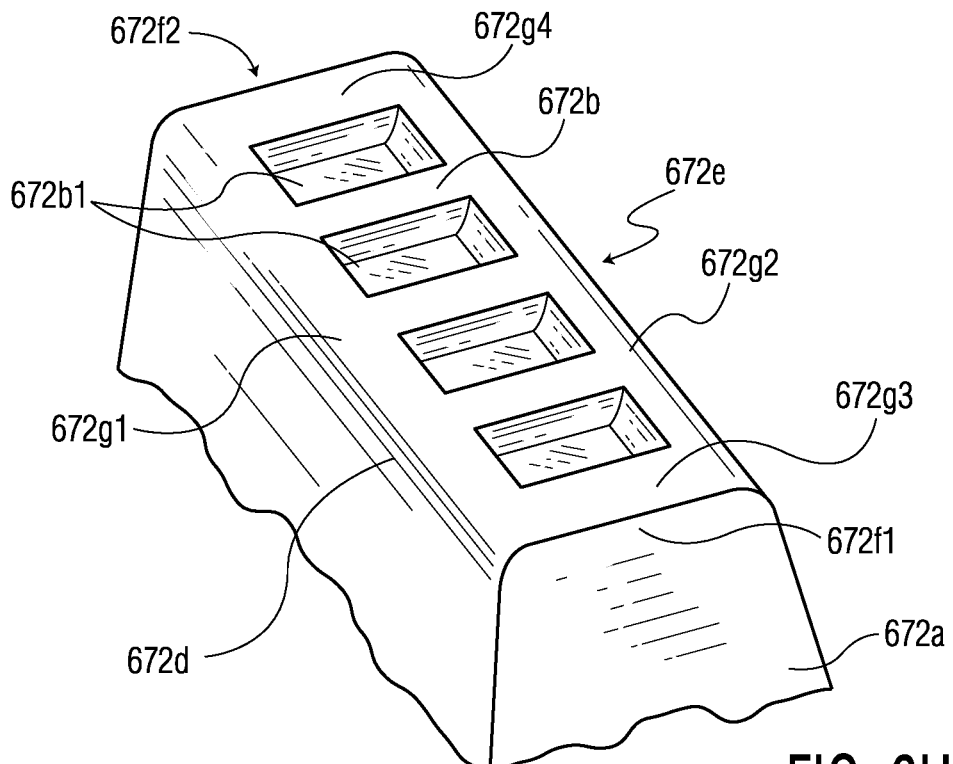

The features on the working surface are not limited to protrusions, but may include recesses, or both recesses and protrusions. FIGS. 6F-6H illustrate exemplary configurations with recesses. FIG. 6F illustrates tip portion 652a including working surface 652b between front edge 652d, back edge 652e, side edge 652f1, and side edge 652f2. Working surface 652b includes a region defining diamond shaped recesses 652b1. Working surface 652b also defines first planar portion 652g1 between the region and front edge 652d, second planar portion 652g2 between the region and back edge 652e, third planar portion 652g3 between the region and side edge 652f1, and fourth planar portion 652g4 between the region and side edge 652f2. FIG. 6G illustrates tip portion 662a including working surface 662b between front edge 662d, back edge 662e, side edge 662f1, and side edge 662f2. Working surface 662b includes a region defining round shaped recesses 662b1. Working surface 662b also defines first planar portion 662g1 between the region and front edge 662d, second planar portion 662g2 between the region and back edge 662e, third planar portion 662g3 between the region and side edge 662f1, and fourth planar portion 662g4 between the region and side edge 662f2. FIG. 6H illustrates tip portion 672a including working surface 672b between front edge 672d, back edge 672e, side edge 672f1, and side edge 672f2. Working surface 672b includes a region defining rectangular shaped recesses 672b1. Working surface 672b also defines first planar portion 672g1 between the region and front edge 672d, second planar portion 672g2 between the region and back edge 672e, third planar portion 672g3 between the region and side edge 672f1, and fourth planar portion 672g4 between the region and side edge 672f2.

Figure 7A:
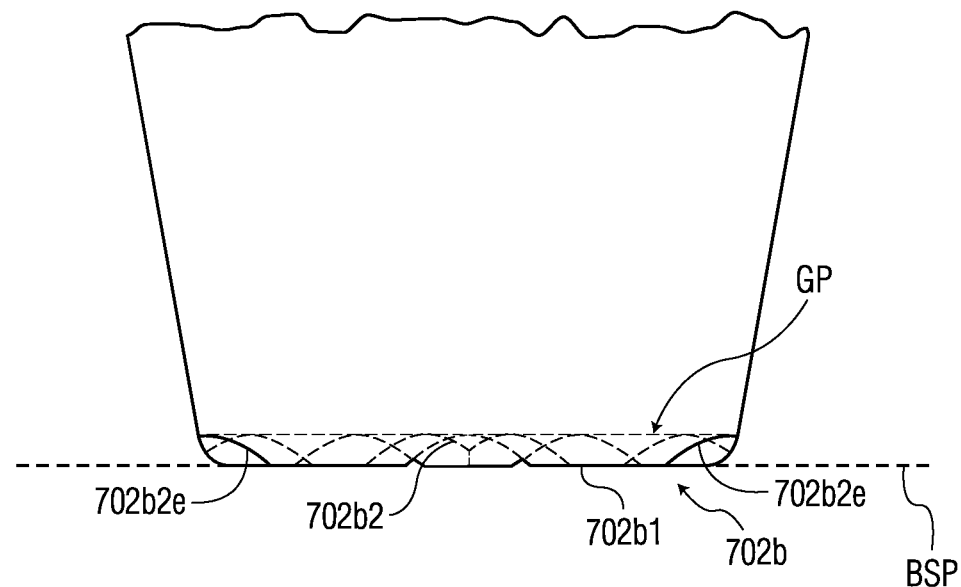
FIG. 7A is a side view of a portion of a conventional ribbon bonding tool.
Figure 7B:
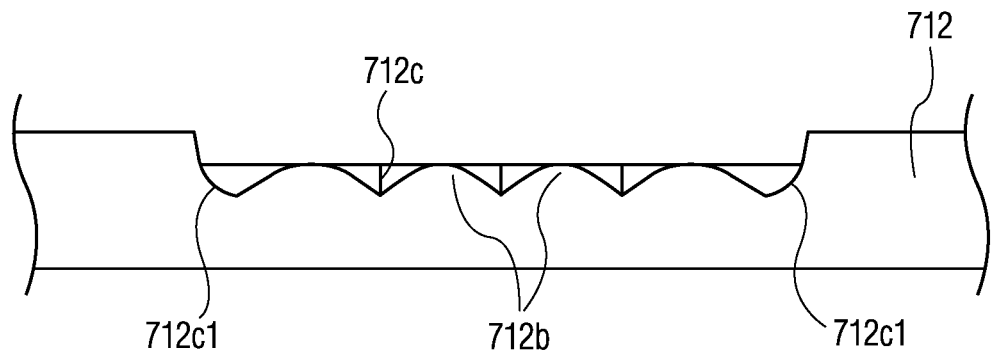
FIG. 7B is a cross sectional view of a portion of a ribbon bond formed using the ribbon bonding tool of FIG. 7A.

FIG. 7A is a side view of a portion of a conventional ribbon bonding tool with working surface 702b having a waffle configuration, with a phantom view of a portion of working surface 702b. Working surface 702b includes protrusions 702b1 (also known as teeth) and recesses 702b2 (also known as grooves). End recesses 702b2e have the same depth as other recesses 702b2. Thus, recesses 702b²/702b2e across working surface 702b define a groove plane GP that is substantially flat and parallel to the bottom surface (labeled as bottom surface plane BSP) of the ribbon bonding tool. FIG. 7B illustrates a portion of ribbon loop 712 formed using the ribbon bonding tool of FIG. 7A. Ribbon loop 712 includes protrusions 712c, and recesses 712c (where recesses 712c have the same depth as end recesses 712c1).

Figure 8A:
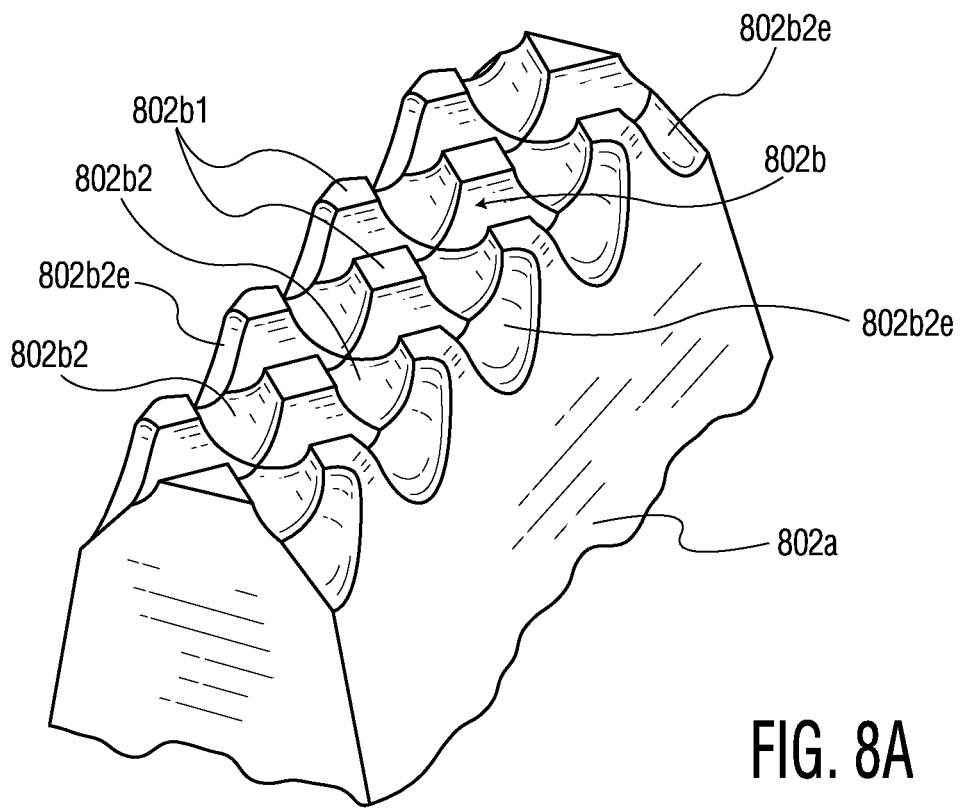
FIGS. 8A-8B are perspective views of tip portions of ribbon bonding tools in accordance with exemplary embodiments of the present invention.
Figure 8B:
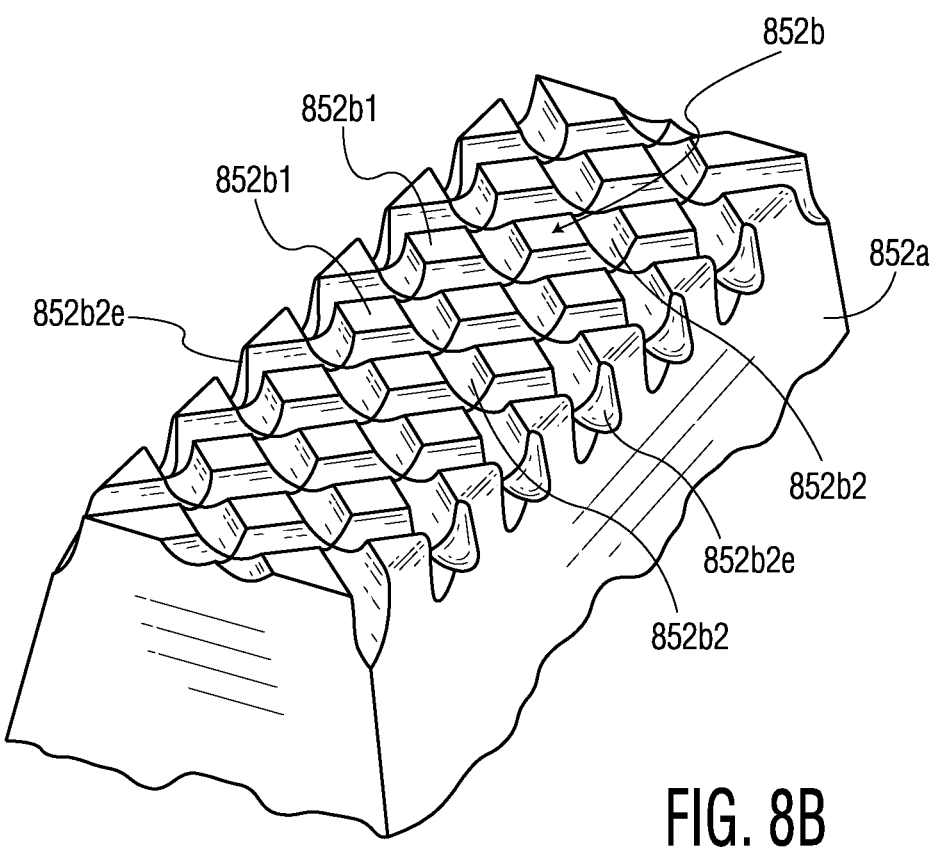

FIGS. 8A-8B are bottom perspective views of tip portions 802a/852a of ribbon bonding tools according to the present invention including recesses of varying depths. FIG. 8A illustrates working surface 802b including protrusions 802b1 (also known as teeth) and recesses 802b2/802b2e. End recesses 802b2e along the front and back edge of tip portion 802a are deeper than other recesses 802b2, thereby resulting in longer protrusions/teeth adjacent the front and back edge of tip portion 802a. FIG. 8B illustrates working surface 852b including protrusions 852b1 and recesses 852b2/852b2e. End recesses 852b2e along the front and back edge of tip portion 852a are deeper than other recesses 852b2, thereby resulting in longer protrusions/teeth adjacent the front and back edge of tip portion 852a. The deeper recesses along the front and back edges allow for thicker ribbon material in a heel region of a ribbon loop formed using the ribbon bonding tool.

Figure 9A:
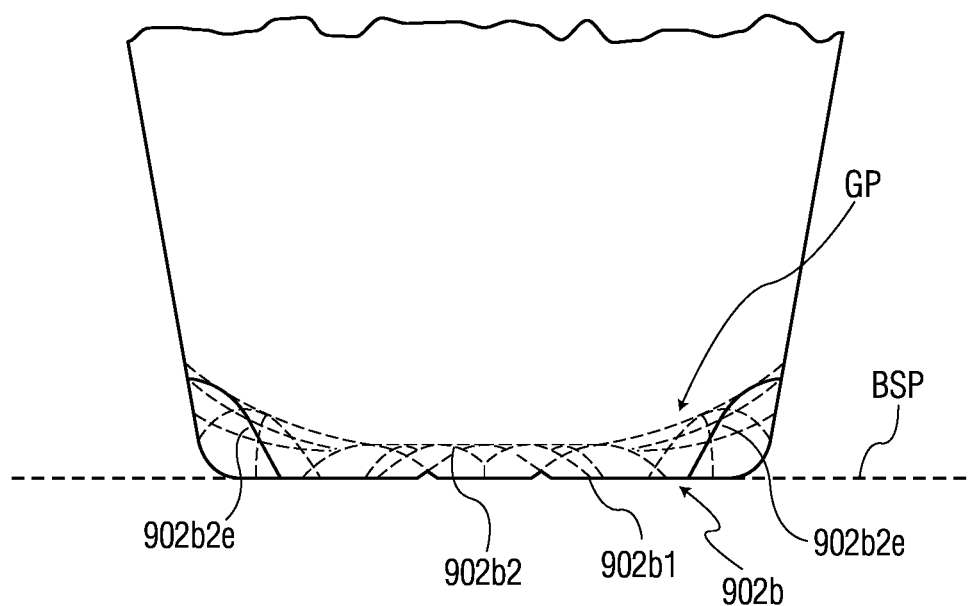
FIG. 9A is a side view of a portion of a ribbon bonding tool in accordance with an exemplary embodiment of the present invention.
Figure 9B:
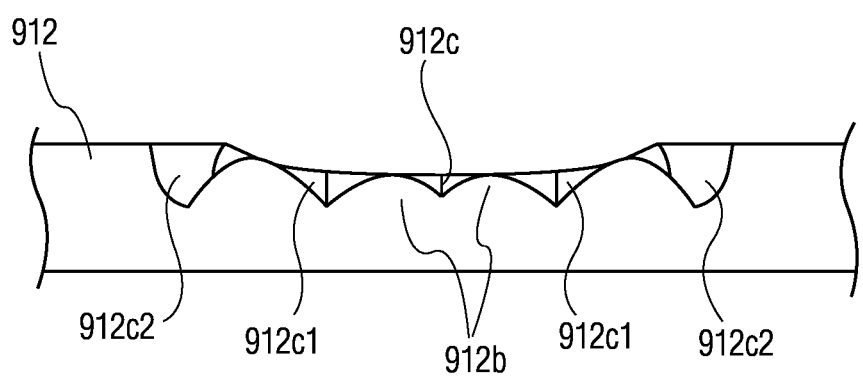
FIG. 9B is a cross sectional view of a portion of a ribbon bond formed using the ribbon bonding tool of FIG. 9A.

FIG. 9A is a side view of a portion of ribbon bonding tool according to an exemplary embodiment of the present invention with working surface 902b having a waffle configuration or the like, with a phantom view of a portion of working surface 902b. Working surface 902b includes protrusions 902b1 (also known as teeth) and recesses 902b2 (also known as grooves). End recesses 902b2e are deeper than recesses 902b2 in the center portion of working surface 902b. In fact, the recesses follow a profile that is deepest at the front and back edges of working surface 902b, and shallowest in a center region of working surface 902b. Thus, recesses 902b2/902b2e across working surface 902b define a curved groove plane GP (the groove plane GP following the shape of working surface 902b at the bottom of the recesses/grooves). FIG. 9B illustrates a portion of ribbon loop 912 formed using the ribbon bonding tool of FIG. 9A. Ribbon loop 912 includes protrusions 912b, and recesses 912c, 912c1, and 912c2. The center recesses 912c are shallowest, and end recesses 912c2 are the deepest, with recesses 912c1 having a depth between that of recesses 912c and that of recesses 912c2. Of course, protrusions 912b will be longer where the recesses are deeper, and shorter when the recesses are shallower, thereby improving the heel strength of the ribbon bonds formed using such a tool.

Figure 10A:
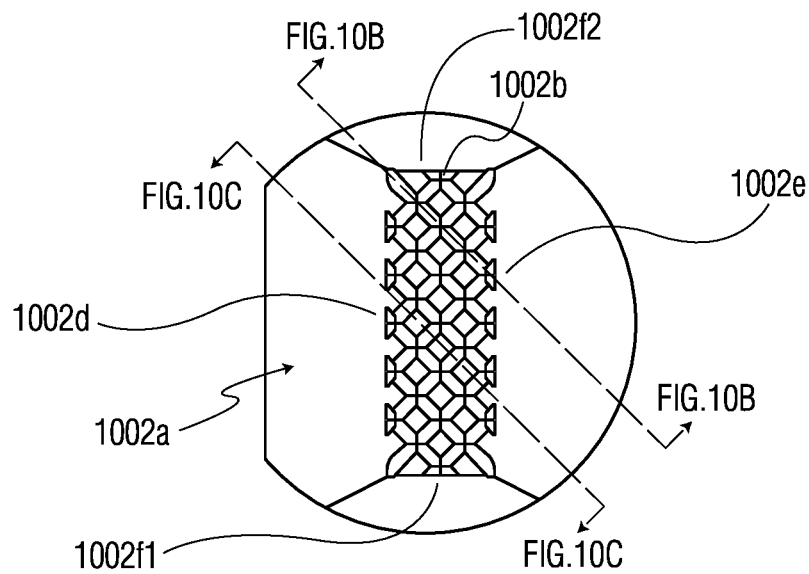
FIG. 10A is a bottom view of a ribbon bonding tool in accordance with an exemplary embodiment of the present invention.
Figure 10B:
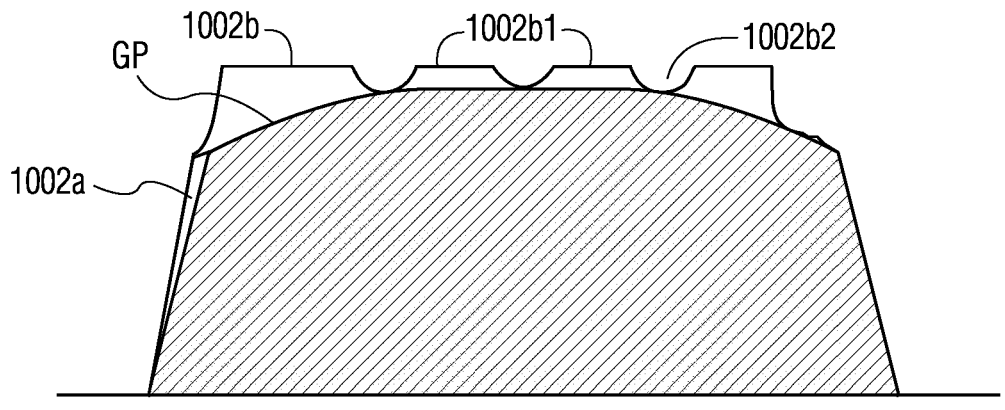
FIGS. 10B-10C are various cross sectional views of the ribbon bonding tool of FIG. 10A.
Figure 10C:
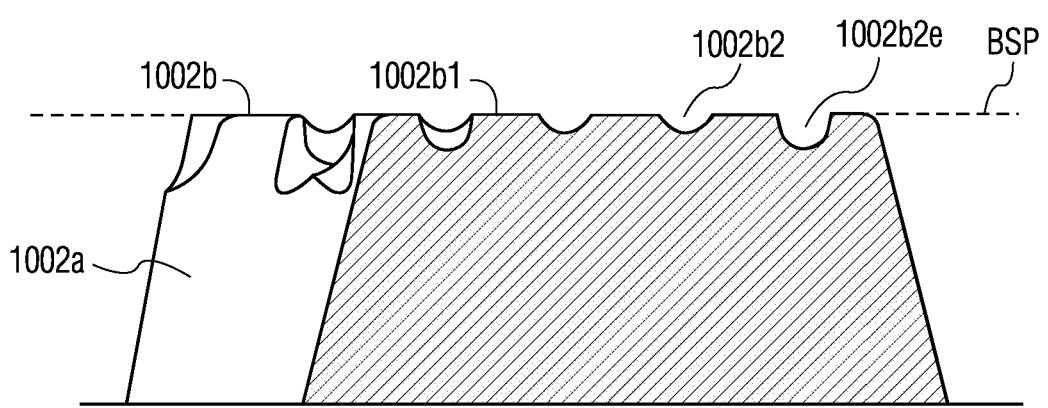

FIG. 10A is a bottom view of tip portion 1002a of a ribbon bonding tool including working surface 1002b (where working surface 1002b includes a waffle configuration including protrusions/teeth and recesses/grooves). FIGS. 10B-10C are sectional views of the ribbon bonding tool of FIG. 10A. FIG. 10B is a sectional view cut across a groove between rows of protrusions 1002b1 (where the recesses 1002b2 are between adjacent protrusions 1002b1), where the varying recess depth defines curved groove plane GP. FIG. 10C is a sectional view cut across a row of protrusions 1002b1, illustrating that end recesses 1002b2e are deeper than recesses 1002b2, thereby defining the curved groove plane GP. The curved groove plane GP illustrated in FIGS. 10A-10C extends from front edge 1002d of working surface 1002b to back edge 1002e of working surface 1002b (and not from side edge 1002f1 to side edge 1002f2).

While FIGS. 9A and 10A illustrate a curved groove plane GP, other configurations are contemplated where the recess/groove depths are deeper adjacent the front and back edges and shallower at the center of the working surface. For example, the grooves could follow an angled, as opposed to a curved, profile.

While the groove plane GP is illustrated as curving along the front to back direction (i.e., from the front edge of the working surface to the back edge of the working surface), the groove plane GP could extend from one side edge of the working surface to the other side edge of the working surface. Further, the working surface of the ribbon bonding tool could have a curved (or varying depth) groove plane that extends in both the front to back direction (as in FIG. 9A) and in the side to side direction (not shown). That is, a depth of the plurality of recesses follows a profile such that a depth of the recesses is shallower at a central portion of the working surface, and increases in each direction extending toward a periphery of the working surface.

Figure 14:
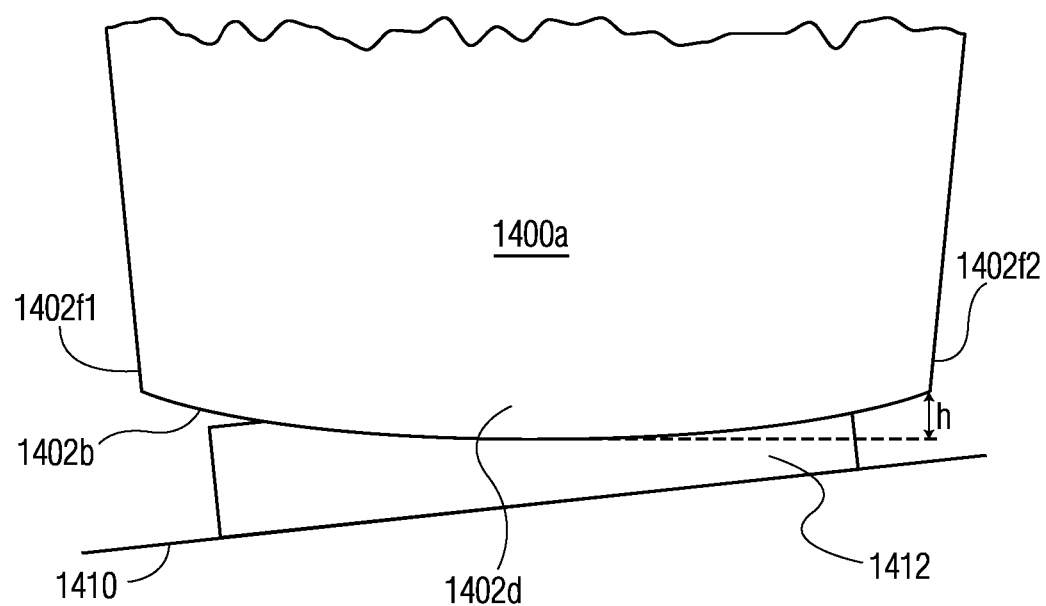
FIG. 14 is a block diagram front view of a portion of a ribbon bonding tool in accordance with an exemplary embodiment of the present invention.

While FIGS. 9A and 10A-10C illustrate ribbon bonding tools including a curved groove plane, the bottom surface of the tool continues to be substantially flat (i.e., extending along plane "BSP" shown in FIGS. 9A and 10C). Ribbon bonding tools having a flat bottom surface may suffer from a number of deficiencies. In certain configurations of the present invention (e.g., as shown in FIGS. 12A-12B and 14) it may be desirable that the bottom surface be curved (or otherwise be varied along its length).

Figure 11A:
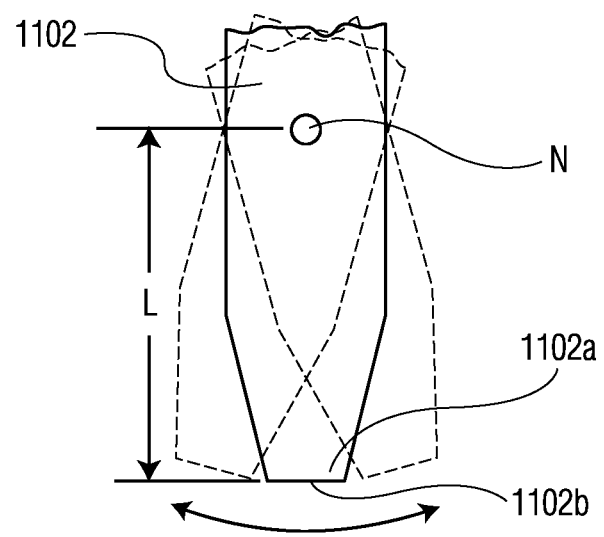
FIGS. 11A-11B are block diagram views of a portion of a conventional ribbon bonding tool.
Figure 11B:
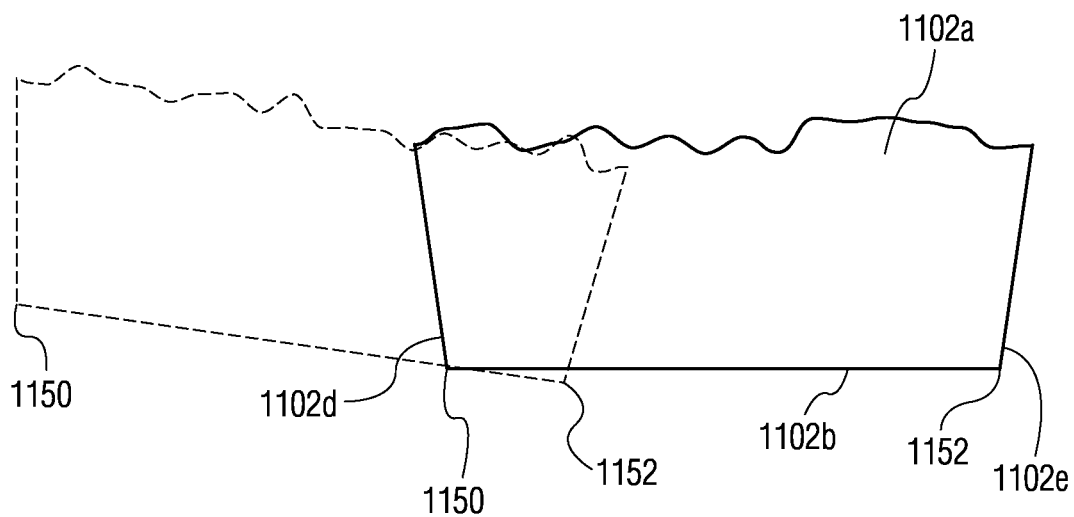

Referring to FIGS. 11A-11B, portions of conventional ribbon bonding tool 1102 are shown. As is understood by those skilled in the art, in order to generate the front to back scrub (in a direction along the length of the ribbon material) desired for forming ribbon bonds, tip portion 1102a rotates about its first transverse vibration node N, located a distance L from working surface 1102b. This distance L is dependent on various factors such resonant frequency, tool material characteristics, etc. Exemplary distances L (and therefore the radius) are between 2-15 mm, 2-10 mm, and 3-5 mm. A standard bond tool has a flat bottom surface that undesirably imparts significant vertical vibration to the bond surface. More specifically, during the rotation about node N, front and back corners 1150, 1152 fall below the level of the bottom surface in its resting state. A potential consequence is that the corners 1150, 1152 generate a vertical vibration or force oscillation in the work surface.

Figure 12A:
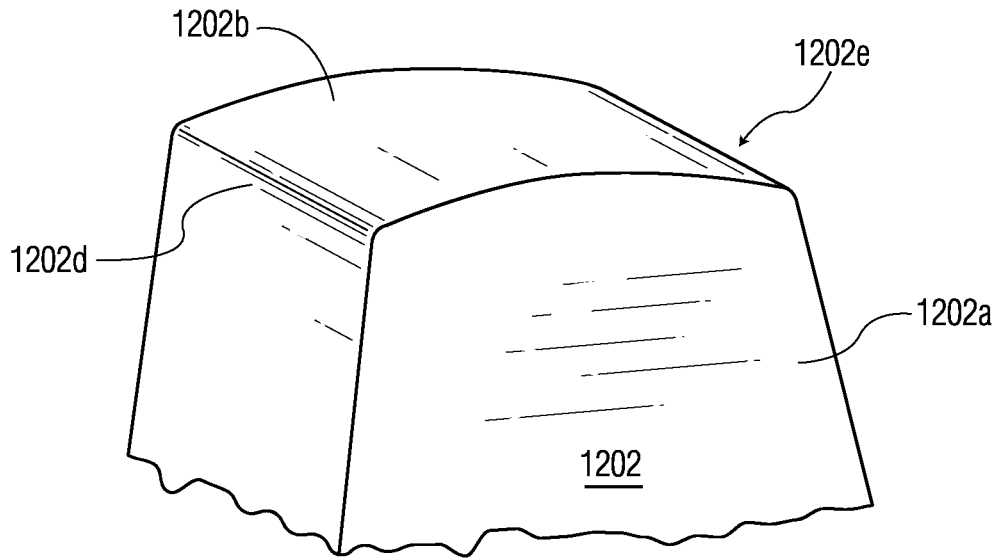
FIG. 12A is a perspective view of a portion of a ribbon bonding tool in accordance with an exemplary embodiment of the present invention.
Figure 12B:
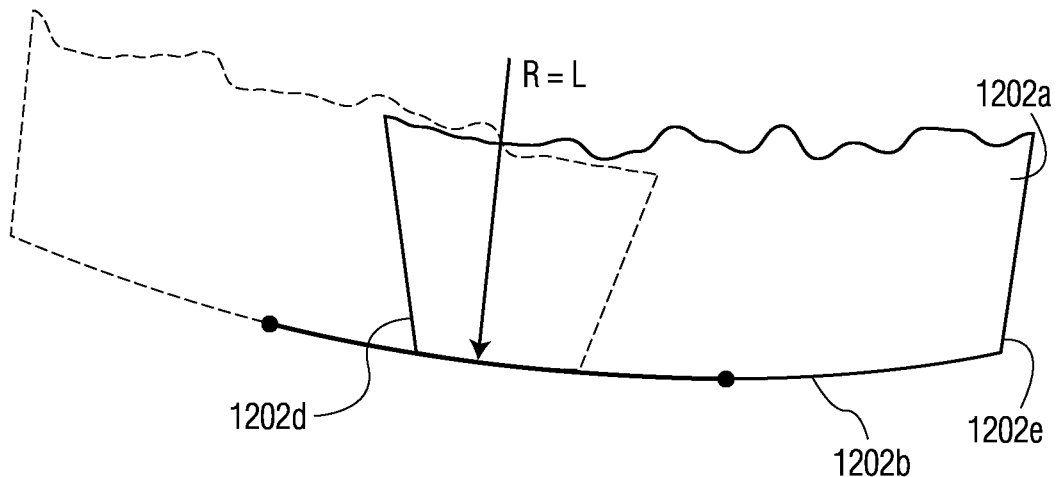
FIG. 12B is a block diagram view of a portion of the ribbon bonding tool of FIG. 12A.

FIGS. 12A-12B illustrates tip portion 1202a of a ribbon bonding tool which includes working surface 1202b. The bottom surface of the ribbon bonding tool has a curved profile from front edge 1202d to back edge 1202e in order to minimize or eliminate vertical excitation of a bond surface during bonding. The radius of the curved profile may be configured as desired. In the illustrated example, the radius R is designed to be equal to the distance L between the bottom surface of the tip portion and the location of the first node N. That is, because the bottom surface is shorter at its edge portions, it is less likely to cause the excitation problems associated with conventional tools having a flat bottom surface.

Although FIGS. 12A-12B are illustrated as including a curved profile the entire length of the working surface from the front edge to the back edge, the present invention is not limited thereto. Any of a number of configurations are possible wherein the working surface extends lower in a center region than (1) at a first surface region extending from a first edge of the working surface toward the center region, and (2) at a second surface region extending from a second edge of the working surface toward the center region. For example, the first and second surface regions may be chamfered, curved, etc. so long as the areas adjacent the first and second edge are shorter than the center area between the first edge and the second edge. For example, the first and second surface regions may be at least 25% of a length of the working surface from the first edge to the second edge. In such an embodiment, the total percentage of the length from the first edge to the second edge that has a reduced length/height is at least 50% (where the remainder of the working surface, such as the center portion, may be flat).

Figure 13:
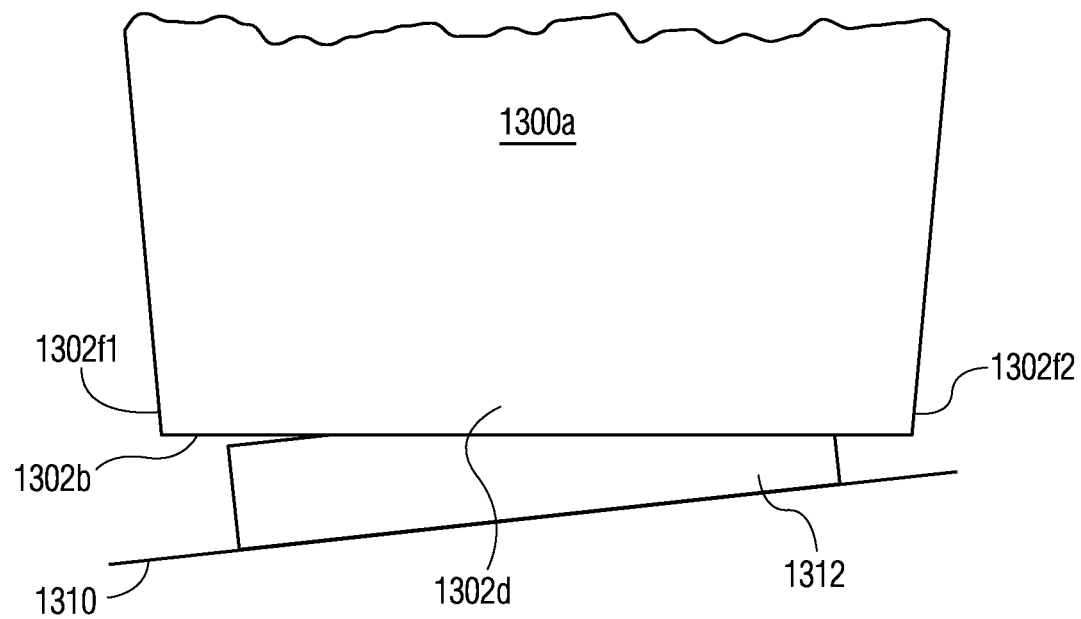
FIG. 13 is a block diagram front view of a portion of a conventional ribbon bonding tool.

FIGS. 12A-12B relate to examples of the present invention where the bottom surface follows a curved profile in a direction from the front edge to the back edge in order to address the potential vertical excitation problem caused by the rotation of the ribbon bonding tool about the node. However, conventional tools having a flat working surface suffer from other deficiencies. For example, FIG. 13 illustrates a front view of tip portion 1300a of a ribbon bonding tool. Thus, front edge 1302d is shown extending between side edge 1302f1 to side edge 1302f2. As will be appreciated by those skilled in the art, bonding locations (e.g., die pads) are often tilted or not flat. If the surface of the bonding location is excessively tilted, ribbon bond formation will be uneven. In extreme cases, the ribbon bonding tool could sink completely through the ribbon on one side, touching the fragile die. FIG. 13 illustrates a tilted bonding location 1310 (e.g., a tilted die pad on a semiconductor die). In this illustration, tip portion 1300a of the ribbon boning tool is pressed through most of portion 1312a of ribbon 1312. Thus, it is possible that a portion of working surface 1302b adjacent side edge 1302f2 (e.g., the corner) could contact and damage bonding location 1310.

FIG. 14 illustrates a front view of tip portion 1400a of a ribbon bonding tool. Thus, front edge 1402d is shown extending between side edge 1402f1 and side edge 1402f2. Unlike working surface 1302b illustrated in FIG. 13 (which is flat), working surface 1402b of tip portion 1400a follows a curved path between side edge 1402f1 and side edge 1402f2. Such a curved path tends to minimize the impact of bonding location tilt (e.g., die tilt) on ribbon bond formation. While such a curved working surface may result in weaker bonding on the outside edges of the ribbon material, the curvature may be designed for an application to provide adequate bonding results. Thus, while the curved surface will tend to result in a variation of the bond strength (e.g., biased to one side) overall bond consistency should improve. Additionally, there is a reduced potential for contact between a portion (e.g., corner) of the ribbon bonding tool and the die or other bonding locations. The height difference h between a side edge and a center point between the side edges may be between, for example, 1-10 mils, but of course may vary considerably based on the application.

Although FIG. 14 illustrates a curved profile from side edge 1402f1 to side edge 1402f1, the present invention is not limited thereto. Any of a number of configurations are possible wherein the working surface extends lower in a center region than (1) at a first surface region extending from a first side edge of the working surface toward the center region, and (2) at a second surface region extending from a second side edge of the working surface toward the center region. For example, the first and second surface regions may be chamfered, curved, etc. so long at the areas adjacent the first and second edge are shorter than the center area between the first edge and the second edge. For example, the first and second surface regions may be at least 25% of a length of the working surface from the first side edge to the second side edge.

Figure 1:
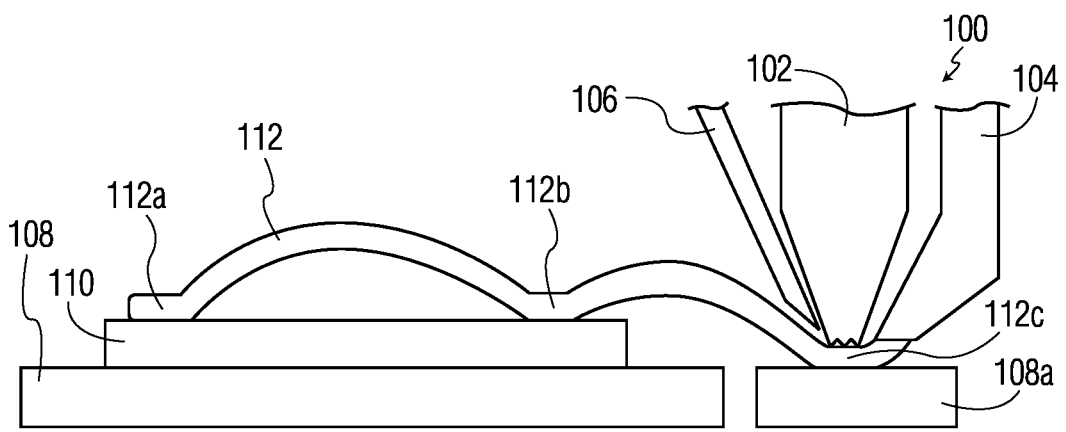
FIG. 1 is a side block diagram view of portions of a ribbon bonding system useful in explaining various exemplary embodiments of the present invention.
Figure 2:
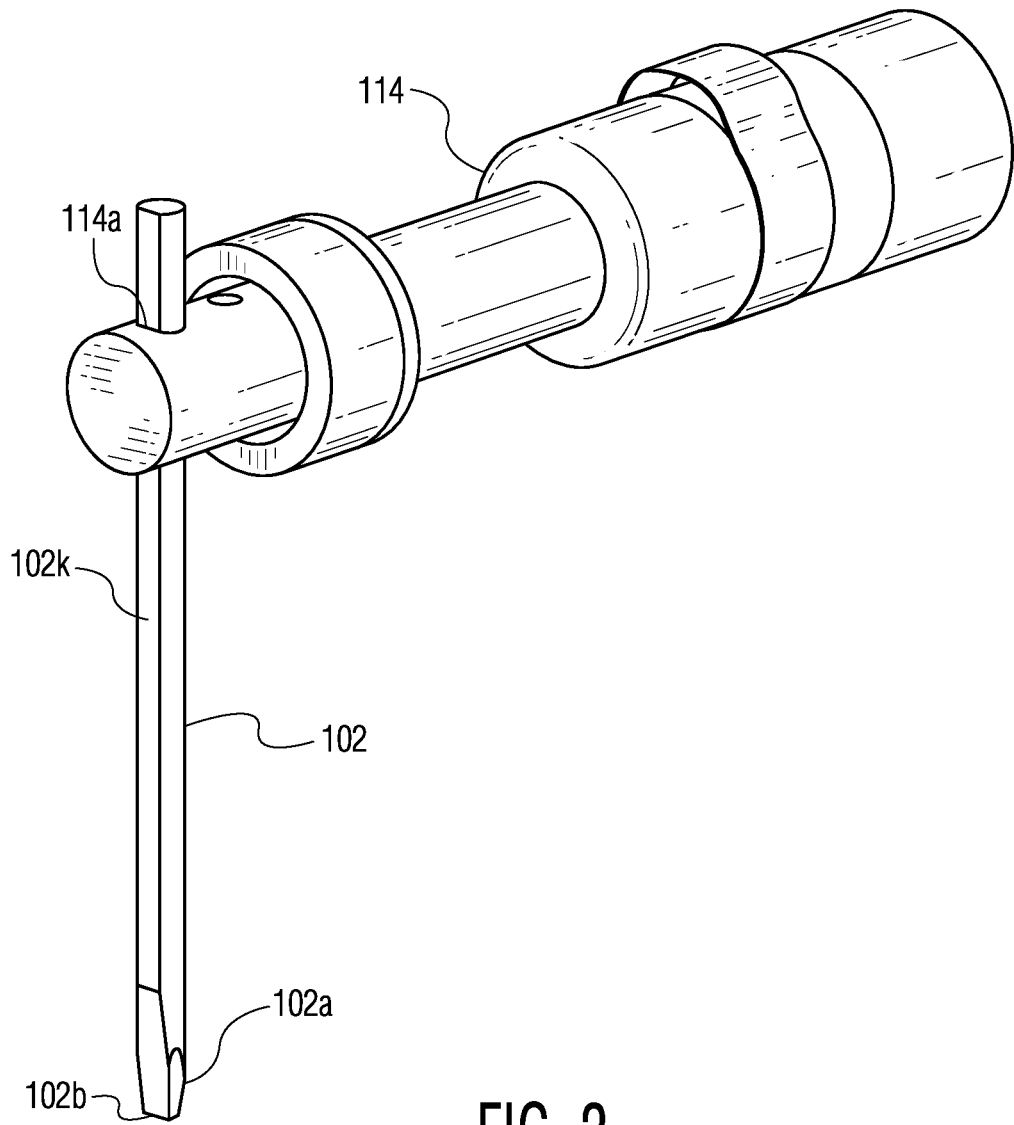
FIG. 2 is a perspective view of a ribbon bonding tool engaged in a transducer useful in explaining various exemplary embodiments of the present invention.
Figure 3A:
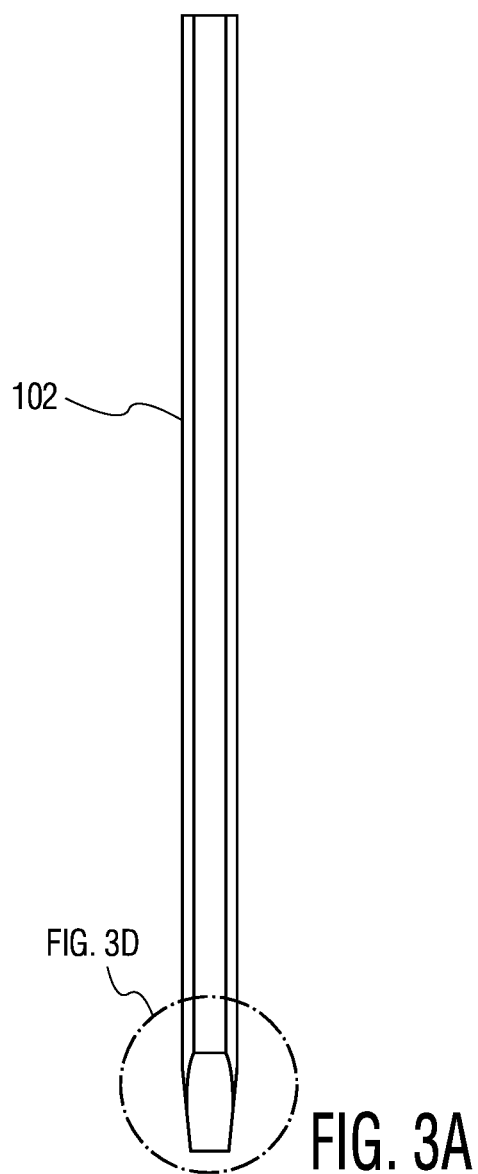
FIGS. 3A-3F are various views of the ribbon bonding tool of FIG. 2.
Figure 3B:
Figure 3C:
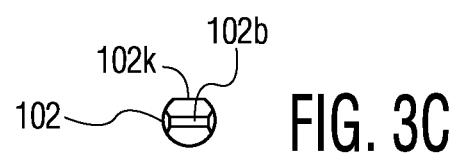
Figure 3D:
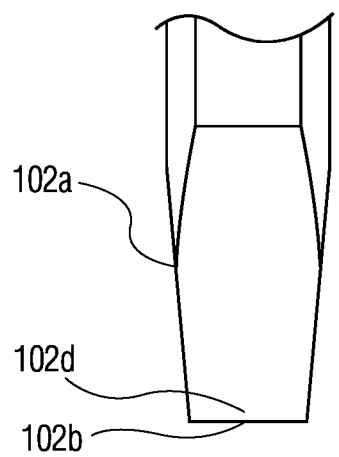
Figure 3E:
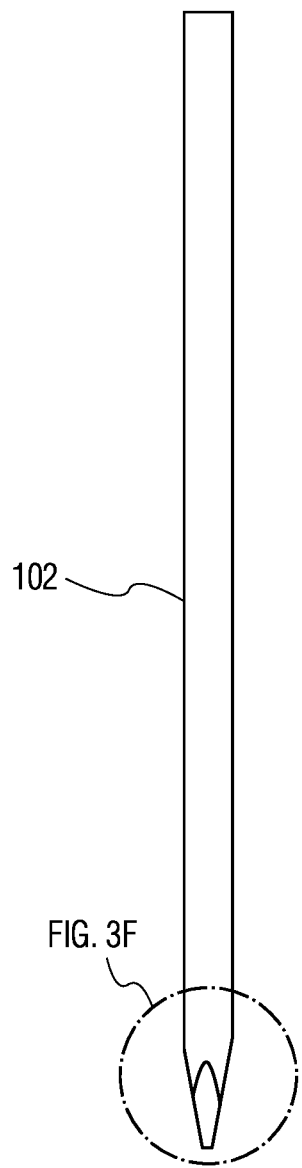
Figure 3F:
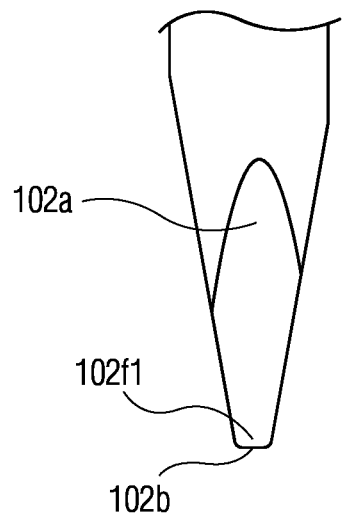
Figure 4A:
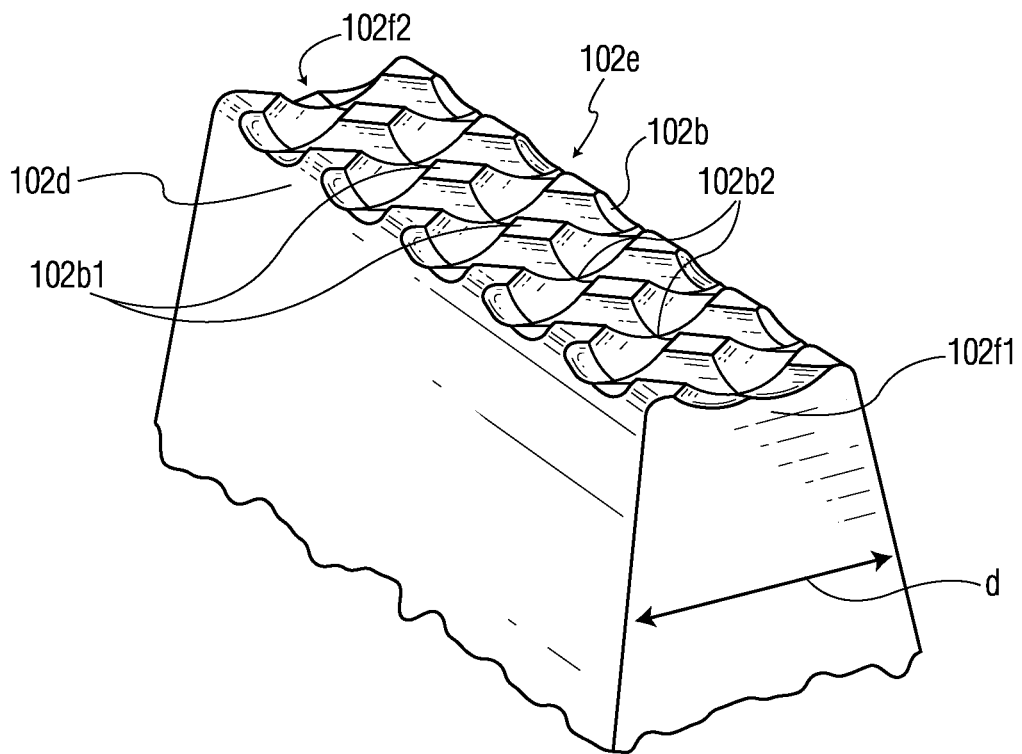
FIG. 4A is a perspective view of a tip portion of a conventional ribbon bonding tool.
Figure 4B:
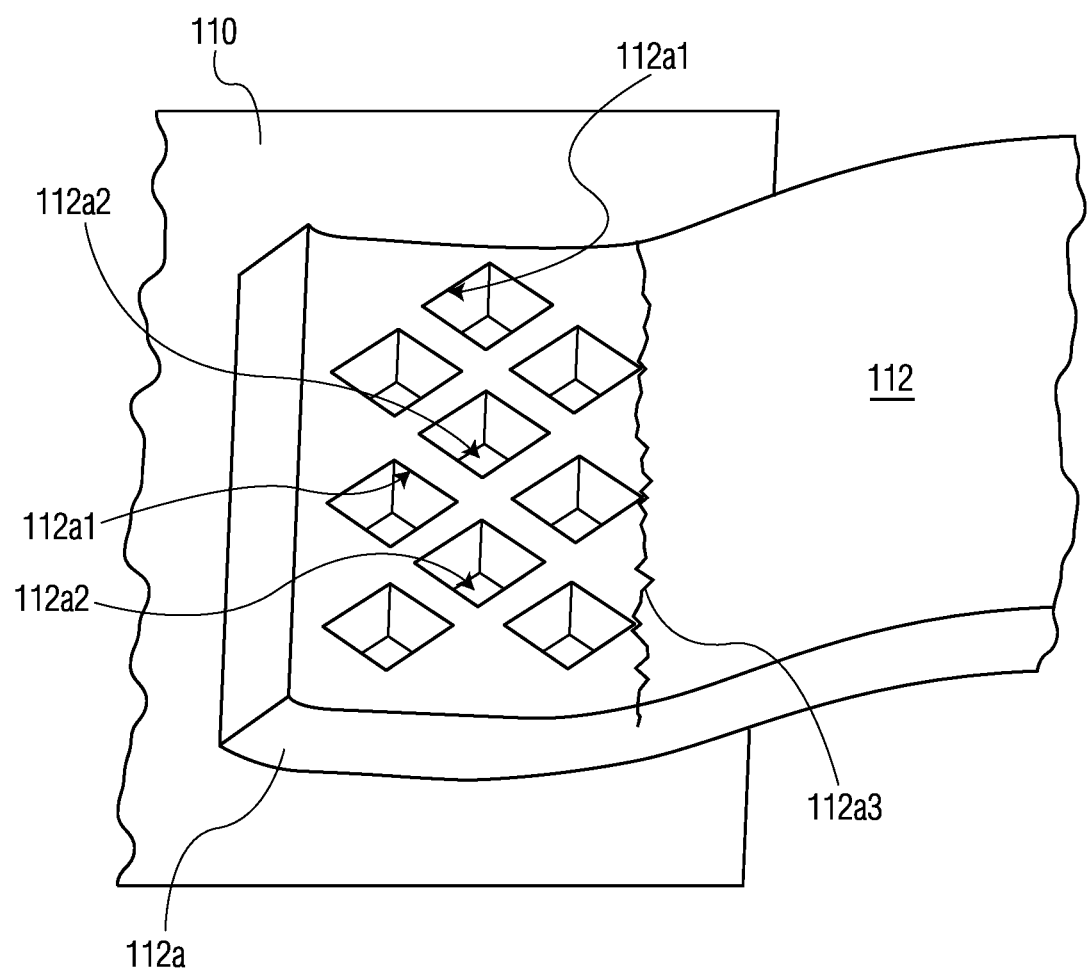
FIG. 4B is a portion of a ribbon loop formed using a conventional ribbon bonding tool.

As illustrated in FIG. 1, ribbon bonding systems may include a ribbon guide (such as guide 104 in FIG. 1) to direct the ribbon material to a ribbon bonding tool, and to facilitate ribbon looping. In FIG. 1, ribbon guide 104 directs the ribbon material (e.g., the material of ribbon loop 112) under ribbon bonding tool 102. In certain ribbon bonding applications (e.g., smaller width ribbon applications), the separate ribbon guide may not be adequate to consistently position the ribbon with the desired accuracy.

FIGS. 15A-15B and 16A-16B illustrate tip portions of ribbon bonding tool that include integrated ribbon guides for guiding the ribbon material under the working surface completely external to the ribbon bonding tool. The integrated ribbon guides are designed to assist in the control of the side-to-side position of the ribbon under the working surface of the ribbon bonding tool. Depending on the application, such designs may (or may not) be used in connection with conventional ribbon guides such as element 104 shown in FIG. 1. The integrated guide will also simplify the complexity of the bond head setup for a ribbon bonding system because the ribbon guide alignment (to the ribbon bonding tool) may be less critical.

Figure 15A:
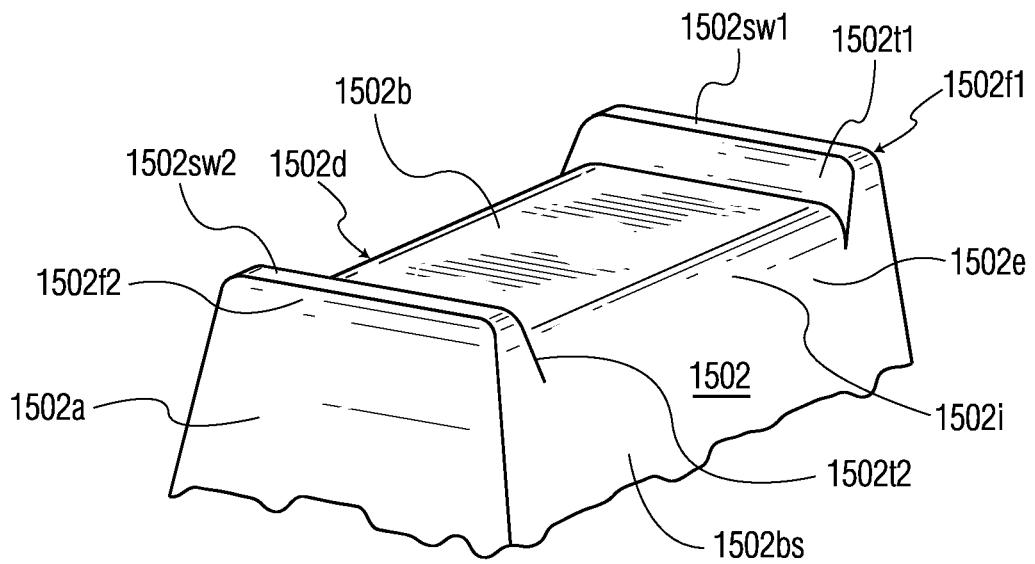
FIGS. 15A-15B are perspective views of a tip portion of a ribbon bonding tool in accordance with an exemplary embodiment of the present invention.
Figure 15B:
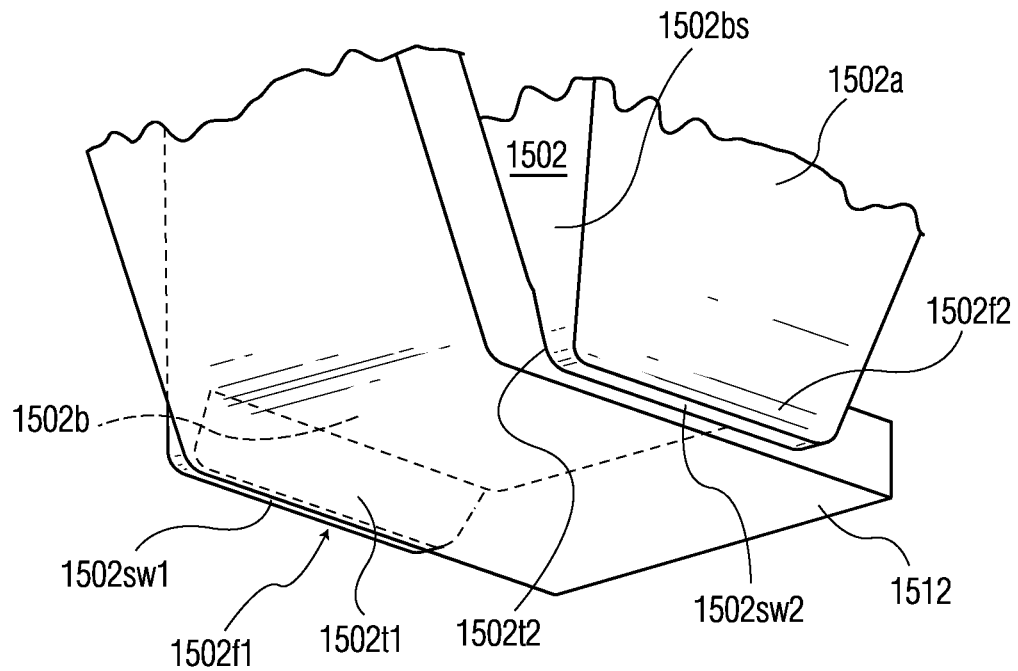

Referring specifically to FIGS. 15A-15B, perspective views of tip portion 1502a of ribbon bonding tool 1502 are provided. Working surface 1502b is defined between two side wall portions 1502sw1 and 1502sw2. Side wall portion 1502sw1 is provided along side edge 1502f1, and side wall portion 1502sw2 is provided along side edge 1502f2. Side wall portion 1502sw1 includes tapered/angled side wall 1502t1, and side wall portion 1502sw2 includes tapered/angled side wall 1502t2. As shown in FIG. 15A, side wall portions 1502sw1 and 1502sw2 extend partially up to back side 1502bs. Ribbon material (e.g., part of ribbon loop 1512 shown in FIG. 15B) is guided from a ribbon supply to a path defined between side wall portions 1502sw1 and 1502sw2 to working surface 1502b. Side wall portions 1502sw1 and 1502sw2 (which extend partially along back side 1502bs) channel the ribbon material to the desired position under working surface 1502b from back edge 1502e to front edge 1502d. The angled configurations of side wall portions 1502sw1 and 1502sw2 assist in the channeling of the ribbon material. The height of side wall portions 1502sw1 and 1502sw2 is preferably small enough that the side wall portions do not touch the bond surface under normal bonding conditions. The width between side wall portions 1502sw1 and 1502sw2 may be substantially the same as the width of the ribbon material being bonded, considering manufacturing tolerances of the ribbon material.

Figure 16A:
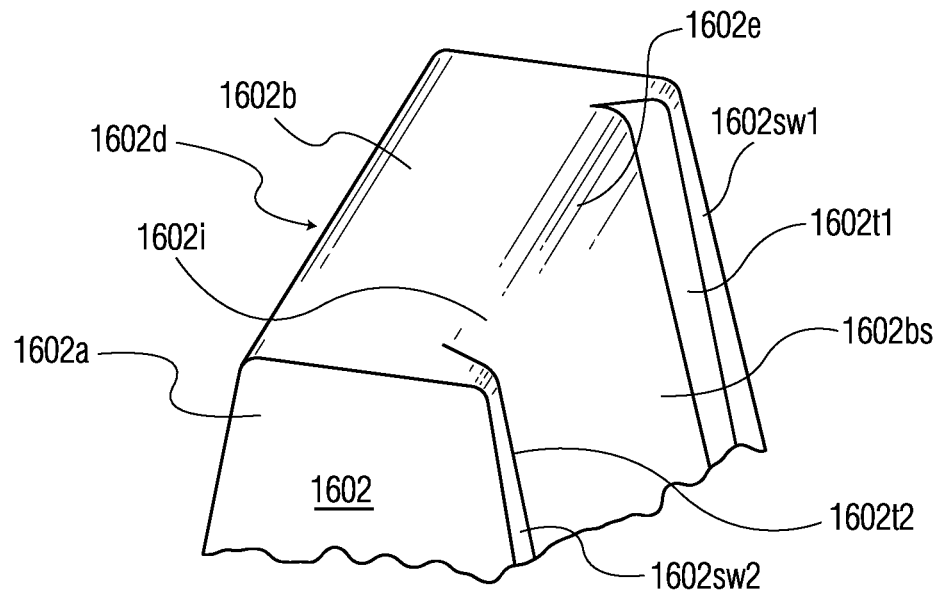
FIGS. 16A-16B are perspective views of a portion of a ribbon bonding tool in accordance with an exemplary embodiment of the present invention.
Figure 16B:
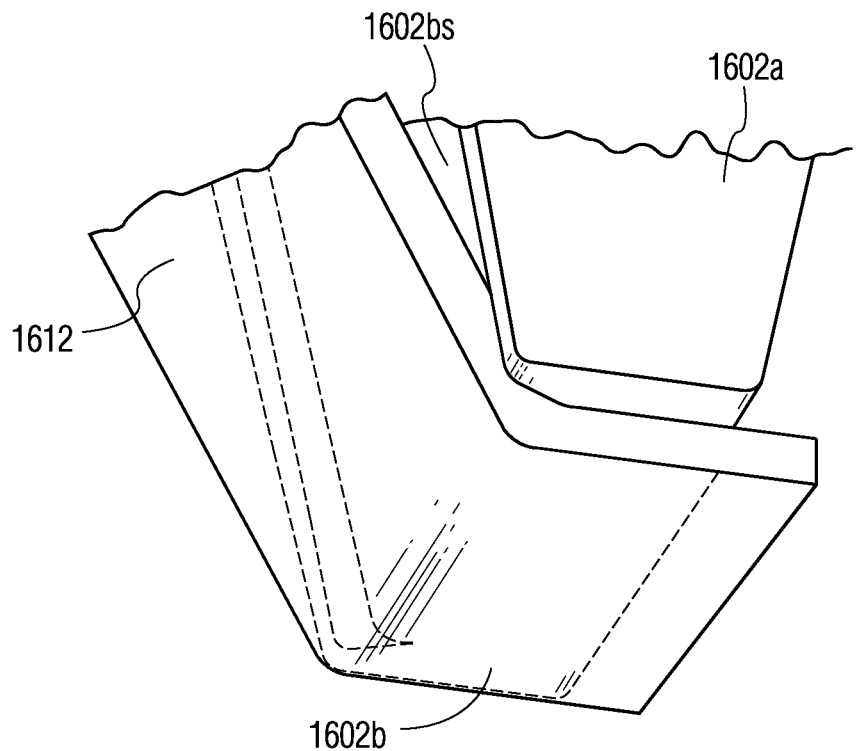

Referring specifically to FIGS. 16A-16B, perspective views of tip portion 1602a of ribbon bonding tool 1602 are provided. Side wall portions 1602sw1 and 1602sw2 extend along a portion of back side 1602bs of ribbon bonding tool 1602. Side wall portion 1602sw1 includes tapered/angled side wall 1602t1, and side wall portion 1602sw2 includes tapered/angled side wall 1602t2. As shown in FIG. 15A, side wall portions 1602sw1 and 1602sw2 extend partially down to working surface 1602b. Ribbon material (e.g., part of ribbon loop 1612 shown in FIG. 16B) is guided from a ribbon supply to a path defined between side wall portions 1602sw1 and 1602sw2 to working surface 1602b. Side wall portions 1602sw1 and 1602sw2 channel the ribbon material to the desired position under working surface 1602b from back edge 1602e to front edge 1602d. The angled configurations of side wall portions 1602sw1 and 1602sw2 assist in the channeling of the ribbon material. If the side wall portions 1602sw1 and 1602sw2 extend partially along working surface 1602b, then the height of at least that portion of side wall portions 1602sw1 and 1602sw2 is preferably small enough that the side wall portions do not touch the bond surface under normal bonding conditions. As with FIGS. 15A-15B, the width between side wall portions 1602sw1 and 1602sw2 may be substantially the same as the width of the ribbon material being bonded, considering manufacturing tolerances of the ribbon material.

Figure 18:
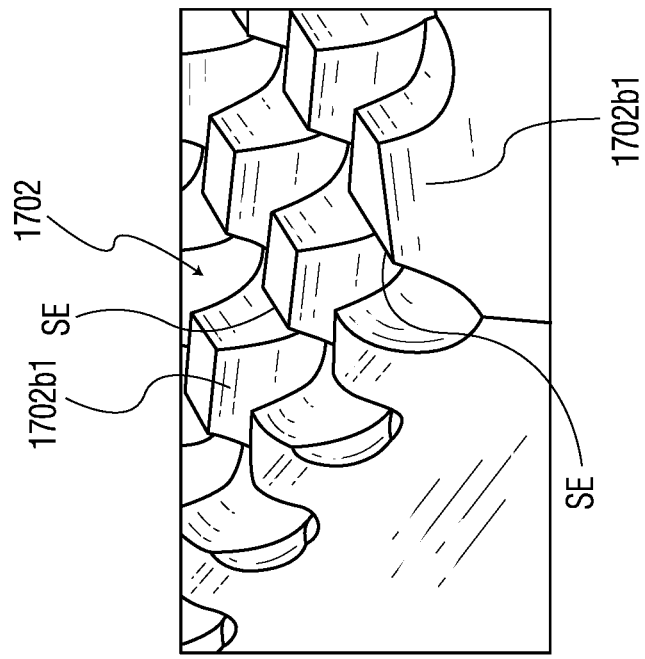
FIG. 18 is a perspective view of a portion of a working surface of a ribbon bonding tool in accordance with an exemplary embodiment of the present invention.
Figure 17:
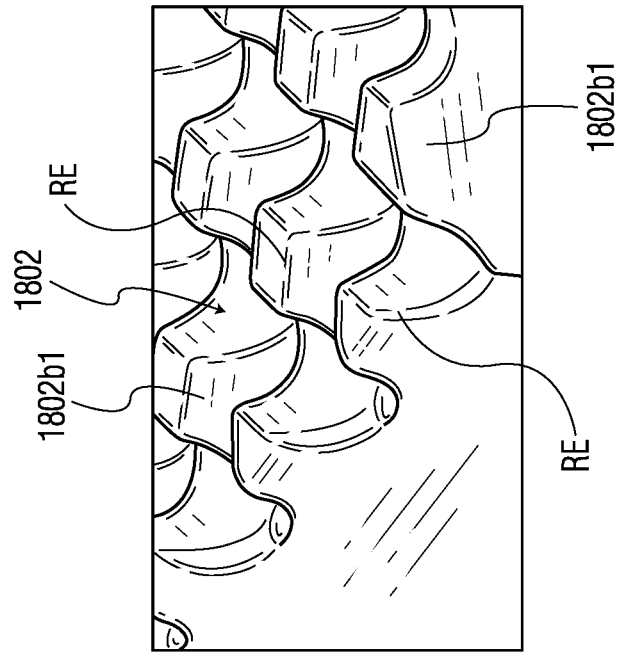
FIG. 17 is a perspective view of a portion of a working surface of a conventional ribbon bonding tool.

The various exemplary ribbon bonding tools disclosed herein may have varying characteristics. For example, while certain of the drawings disclose the working surface as being substantially planar (e.g., FIGS. 12A-12B, FIG. 14, FIGS. 15A-15B, and FIGS. 16A-16B), it is understood that any of the tools may have a working surface with a waffle or grid configuration or other configuration defining a plurality of protrusions and recesses (e.g., such as shown in others of the drawings). FIG. 17 is a perspective view of a portion of working surface 1702b of a conventional ribbon bonding tool, where working surface 1702b defines a plurality of protrusions 1702b1 (and recesses as illustrated) in a waffle type configuration. Protrusions 1702b1 define sharp edges SE which undesirably can damage the ribbon material being bonded, and may undesirably contribute to build-up of ribbon material in the waffle pattern. FIG. 18 is a perspective view of a portion of working surface 1802b of an inventive ribbon bonding tool, where working surface 1802b defines a plurality of protrusions 1802b1 (and recesses as illustrated) in a waffle type configuration. In contrast to sharp edges SE in FIG. 17, protrusions 1802b1 define rounded edges RE. For example, corners of protrusions/teeth 1802b1, may be rounded if they are sharper than 1 mil, with a maximum of 2 mils.

Various embodiments of the present invention include features on or adjacent the working surface of a ribbon bonding tool including, for example, protrusions/teeth, recesses/grooves, rounded edges, side walls portions, amongst others. Such features may be formed by various methods (e.g., using computer control) including, for example, laser-machining, fluid-jet milling, direct molding, mechanical grinding, or EDM (electrical discharge machining).

Although the present invention includes the aforementioned features (e.g., protrusions/teeth, recesses/grooves, rounded edges, side walls portions) having exemplary shapes/dimensions, it is understood that alternative shapes/dimensions are contemplated.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A ribbon bonding tool comprising:
    a body portion including a tip portion,
    the tip portion including a working surface, the tip portion including two side wall portions extending along an exterior surface of at least a portion of a back side of the ribbon bonding tool wherein a ribbon path is defined along the exterior surface between the two side wall portions such that a ribbon material is guided from the ribbon path to the working surface.

2. The ribbon bonding tool of claim 1 wherein the side wall portions are tapered.

3. The ribbon bonding tool of claim 1 wherein the side wall portions are curved.

4. The ribbon bonding tool of claim 1 wherein the two side wall portions extend at least partially along a bottom edge of the ribbon bonding tool such that the ribbon path is defined along at least a portion of the back side of the ribbon bonding tool and along at least a portion of the bottom edge.

5. An ultrasonic ribbon bonding machine comprising:
    a ribbon bonding tool having a body portion including a tip portion, the tip portion including a working surface, the tip portion including two side wall portions extending along an exterior surface of at least a portion of a back side of the ribbon bonding tool wherein a ribbon path is defined between the two side wall portions; and
    a ribbon supply including ribbon to be bonded to a workpiece using the ribbon bonding tool, the ribbon being guided toward the working surface of the ribbon bonding tool using the two side wall portions along the exterior surface to align the ribbon therebetween.

6. The ultrasonic ribbon bonding machine of claim 5 wherein the side wall portions are tapered.

7. The ultrasonic ribbon bonding machine of claim 5 wherein the side wall portions are curved.

8. The ultrasonic ribbon bonding machine of claim 5 wherein the two side wall portions extend at least partially along a bottom edge of the ribbon bonding tool such that the ribbon path is defined along at least a portion of the back side of the ribbon bonding tool and along at least a portion of the bottom edge.

9. The ribbon bonding tool of claim 1 wherein a width between the two side wall portions is substantially the same as a width of the ribbon material.

10. The ribbon bonding tool of claim 1 wherein the working surface defines a plurality of protrusions and a plurality of recesses.

11. The ribbon bonding tool of claim 10 wherein the plurality of protrusions define rounded edges.

12. The ribbon bonding tool of claim 1 wherein the working surface defines a plurality of protrusions and a plurality of recesses in a waffle type configuration.

13. The ribbon bonding tool of claim 12 wherein the plurality of protrusions define rounded edges.

14. The ultrasonic ribbon bonding machine of claim 5 wherein a width between the two side wall portions is substantially the same as a width of the ribbon material.

15. The ultrasonic ribbon bonding machine of claim 5 wherein the working surface defines a plurality of protrusions and a plurality of recesses.

16. The ultrasonic ribbon bonding machine of claim 15 wherein the plurality of protrusions define rounded edges.

17. The ultrasonic ribbon bonding machine of claim 5 wherein the working surface defines a plurality of protrusions and a plurality of recesses in a waffle type configuration.

18. The ultrasonic ribbon bonding machine of claim 17 wherein the plurality of protrusions define rounded edges.

* * * * *